US010409160B2

(12) United States Patent
Kandanarachchi et al.

(10) Patent No.: US 10,409,160 B2
(45) Date of Patent: Sep. 10, 2019

(54) PHOTOIMAGEABLE POLYOLEFIN COMPOSITIONS CONTAINING PHOTOBASE GENERATORS

(71) Applicant: PROMERUS, LLC, Brecksville, OH (US)

(72) Inventors: Pramod Kandanarachchi, Brecksville, OH (US); Larry F Rhodes, Brecksville, OH (US); Hendra Ng, Brecksville, OH (US); Wei Zhang, Brecksville, OH (US); Brian Knapp, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/918,604

(22) Filed: Mar. 12, 2018

(65) Prior Publication Data

US 2018/0203349 A1    Jul. 19, 2018

Related U.S. Application Data

(63) Continuation of application No. 15/042,240, filed on Feb. 12, 2016, now Pat. No. 9,952,507.

(60) Provisional application No. 62/117,774, filed on Feb. 18, 2015.

(51) Int. Cl.
G03F 7/004    (2006.01)
G03F 7/038    (2006.01)
G03F 7/039    (2006.01)

(52) U.S. Cl.
CPC .......... *G03F 7/0045* (2013.01); *G03F 7/0046* (2013.01); *G03F 7/038* (2013.01); *G03F 7/0388* (2013.01); *G03F 7/0392* (2013.01); *G03F 7/0395* (2013.01); *G03F 7/0397* (2013.01)

(58) Field of Classification Search
CPC ...... G03F 7/038; G03F 7/0388; G03F 7/0392; G03F 7/0397; G03F 7/0395; G03F 7/0045

See application file for complete search history.

(56) References Cited

U.S. PATENT DOCUMENTS

| | | |
|---|---|---|
| 5,563,011 A | 10/1996 | Shipley |
| 6,395,451 B1 | 5/2002 | Jung |
| 6,503,686 B1 | 1/2003 | Fryd |
| 2004/0023150 A1 | 2/2004 | Feiring |
| 2004/0196962 A1 | 10/2004 | Kurosawa |
| 2009/0189277 A1 | 7/2009 | Apanius et al. |
| 2014/0087293 A1 | 3/2014 | Kandanarachchi et al. |
| 2015/0079507 A1 | 3/2015 | Kandanarachchi |
| 2017/0153546 A1* | 6/2017 | Kandanarachchi ....... C08F 8/12 |

FOREIGN PATENT DOCUMENTS

| | | |
|---|---|---|
| EP | 1 246 013 A2 | 10/2002 |
| WO | WO 02/093263 A1 | 11/2002 |
| WO | WO 2015/141527 A1 | 9/2015 |

OTHER PUBLICATIONS

Chae et al., Macromol. Rapid Commun. 2000, 21, 1007-1012.

\* cited by examiner

*Primary Examiner* — Cynthia Hamilton
(74) *Attorney, Agent, or Firm* — Balaram Gupta

(57) ABSTRACT

Embodiments in accordance with the present invention encompass self-imagable polymer compositions containing a variety of photobase generators which are useful for forming films that can be patterned to create structures for microelectronic devices, microelectronic packaging, microelectromechanical systems, optoelectronic devices and displays. The compositions of this invention can be tailored to form positive tone or negative tone images depending upon the intended application in aqueous developable medium. The images formed therefrom exhibit improved properties including low wafer stress and better thermo-mechanical properties, among other property enhancements.

7 Claims, 3 Drawing Sheets

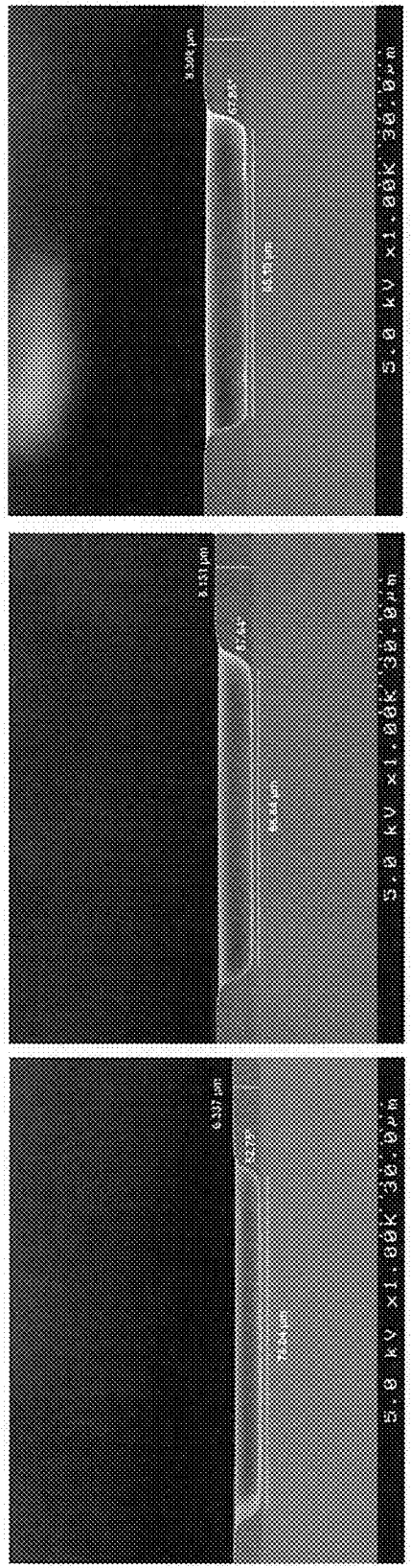
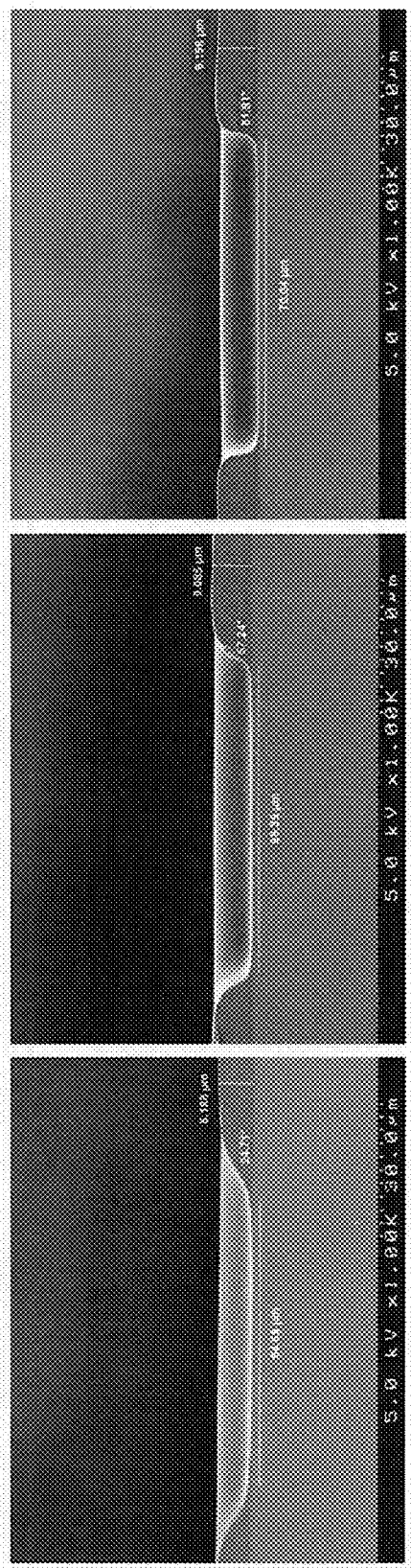
FIG. 3A  FIG. 3B  FIG. 3C
FIG. 4A  FIG. 4B  FIG. 4C

PHOTOIMAGEABLE POLYOLEFIN COMPOSITIONS CONTAINING PHOTOBASE GENERATORS

CROSS REFERENCE TO RELATED APPLICATIONS

This application is a continuation of U.S. application Ser. No. 15/042,240, filed Feb. 12, 2016, now allowed, which claims the benefit of U.S. Provisional Application No. 62/117,774, filed Feb. 18, 2015, both of which are incorporated herein by reference in their entirety.

BACKGROUND OF THE INVENTION

Field of the Invention

Embodiments in accordance with the present invention relate generally to photoimagable compositions containing certain photobase generators (PBG) for forming microelectronic and/or optoelectronic devices and assemblies thereof, and more specifically to compositions encompassing polymers derived from olefinic monomers, such as norbornene (NB) and/or styrene, and maleic anhydride that are inexpensive yet exhibit improved properties, including low wafer stress and better thermo-mechanical properties.

Description of the Art

Organic polymer materials are increasingly being used in the microelectronics and optoelectronics industries for a variety of applications. For example, the uses for such organic polymer materials include interlevel dielectrics, redistribution layers (RDL), stress buffer layers, chip stacking and/or bonding, leveling or planarization layers, alpha-particle barriers, passivation layers, among others, in the fabrication of a variety of microelectronic and optoelectronic devices. Where such organic polymer materials are photosensitive, thus self-imagable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS), microoptoelectromechanical systems (MOEMS) and the semiconductor device encompassing a complementary metal oxide semiconductor (CMOS) image sensor dam structure, and the like.

While certain of the currently available organic photosensitive compositions are used in some of the aforementioned applications, there is still a need for organic photosensitive compositions which are aqueous negative or positive tone developable especially in such applications as RDL, chip stacking/bonding and CMOS, where there is a growing concern to avoid solvents as the increase demand in such applications has resulted in more solvent waste. At the same time any new aqueous developable compositions should still feature same or better properties than the currently used solvent developable compositions. In particular, several of the current compositions utilize polymers such as polyimide, benzocyclobutenes (BCB) and silicones are expensive, and some of which utilize solvents for developing.

Accordingly, there is still a need for lower cost aqueous developable negative or positive tone compositions which feature better properties, such as for example, i) lower temperature curing which still maintains pattern integrity, ii) improved thermo-mechanical properties, iii) improved elongation to break (ETB), and iv) lower wafer stress, just to name a few.

SUMMARY OF THE INVENTION

It has now been found that by employing one or more photobase generators (TBG), it is now possible to fabricate a semiconductor device which features hitherto unachievable properties, i.e., improved thermo-mechanical properties, improved elongation to break, and lower wafer stress, yet can be readily integrated into conventional applications, such as for example, CMOS image sensor (CIS) applications or redistribution layer (RDL) applications, and the like.

Accordingly, there is provided a photoimagable composition encompassing:

a) a polymer having one or more first type of repeating units represented by formula (IA), said first type of repeating unit is derived from a monomer of formula (I):

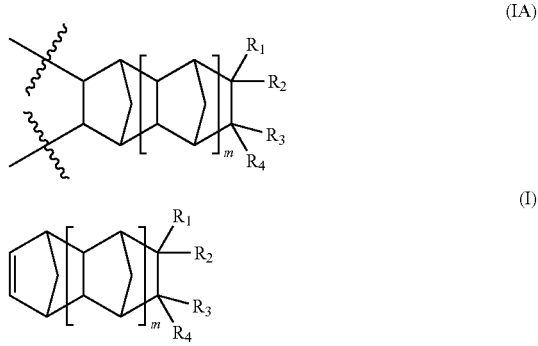

wherein:
m is an integer 0, 1 or 2;
$R_1$, $R_2$, $R_3$ and $R_4$ are the same or different and each independently represents hydrogen, halogen, a hydrocarbyl or halohydrocarbyl group selected from linear or branched $(C_1-C_{12})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, $-(CH_2)_a-C(CF_3)_2$ OR, $-(CH_2)_a-CO_2R$, a group of formula (A):

$$-(CH_2)_b-(OCH_2-CH_2)_c-OR \qquad (A);\text{ and}$$

a group of formula (B):

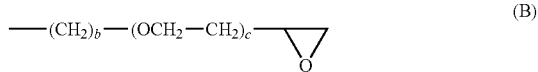

wherein:
a is an integer from 0 to 4
b is an integer from 0 to 10;
c is an integer 0, 1, 2, 3 or 4; and
R is hydrogen, linear or branched $(C_1-C_6)$alkyl, $(C_5-C_8)$cycloalkyl, $(C_6-C_{10})$aryl or $(C_7-C_{12})$aralkyl;

and/or a second type of repeating unit represented by formula (IIA), said second type of repeating unit is derived from a monomer of formula (II):

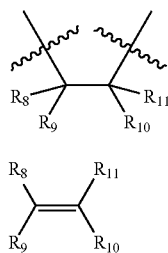

(IIA)

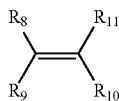

(II)

wherein $R_8$, $R_9$, $R_{10}$ and $R_{11}$ are the same or different and each independently of one another is selected from hydrogen, linear or branched $(C_1-C_6)$alkyl, $(C_5-C_8)$cycloalkyl, $(C_6-C_{10})$aryl and $(C_7-C_{12})$aralkyl; and a third type of repeating unit represented by formula (IIIA) or (IIIB), said second type of repeating unit is derived from a monomer of formula (III):

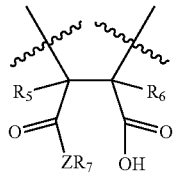

(IIIA)

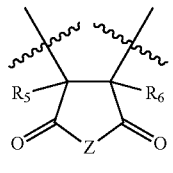

(IIIB)

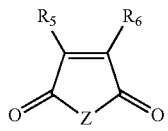

(III)

wherein:

Z is O or N—$R_{12}$ wherein $R_{12}$ is hydrogen, linear or branched $(C_1-C_9)$alkyl, $(C_3-C_7)$cycloalkyl and $(C_6-C_{12})$aryl;

$R_5$, $R_6$ and $R_7$ are each independently of one another selected from hydrogen, linear or branched $(C_1-C_9)$alkyl, fluorinated or perfluorinated$(C_1-C_9)$alkyl, $(C_6-C_{12})$aryl and $(C_6-C_{12})$aryl$(C_1-C_{12})$alkyl; and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, acetoxy, phenyl, hydroxyphenyl and acetoxyphenyl;

b) a photobase generator; and d) a carrier solvent.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

FIGS. 3A to 3C show the SEM micrographs of a cross section of 75 μm vias obtained with a composition embodiment of this invention.

FIGS. 4A to 4C show the SEM micrographs of a cross section of 75 μm vias obtained with another composition embodiment of this invention.

DETAILED DESCRIPTION

Figure 1:
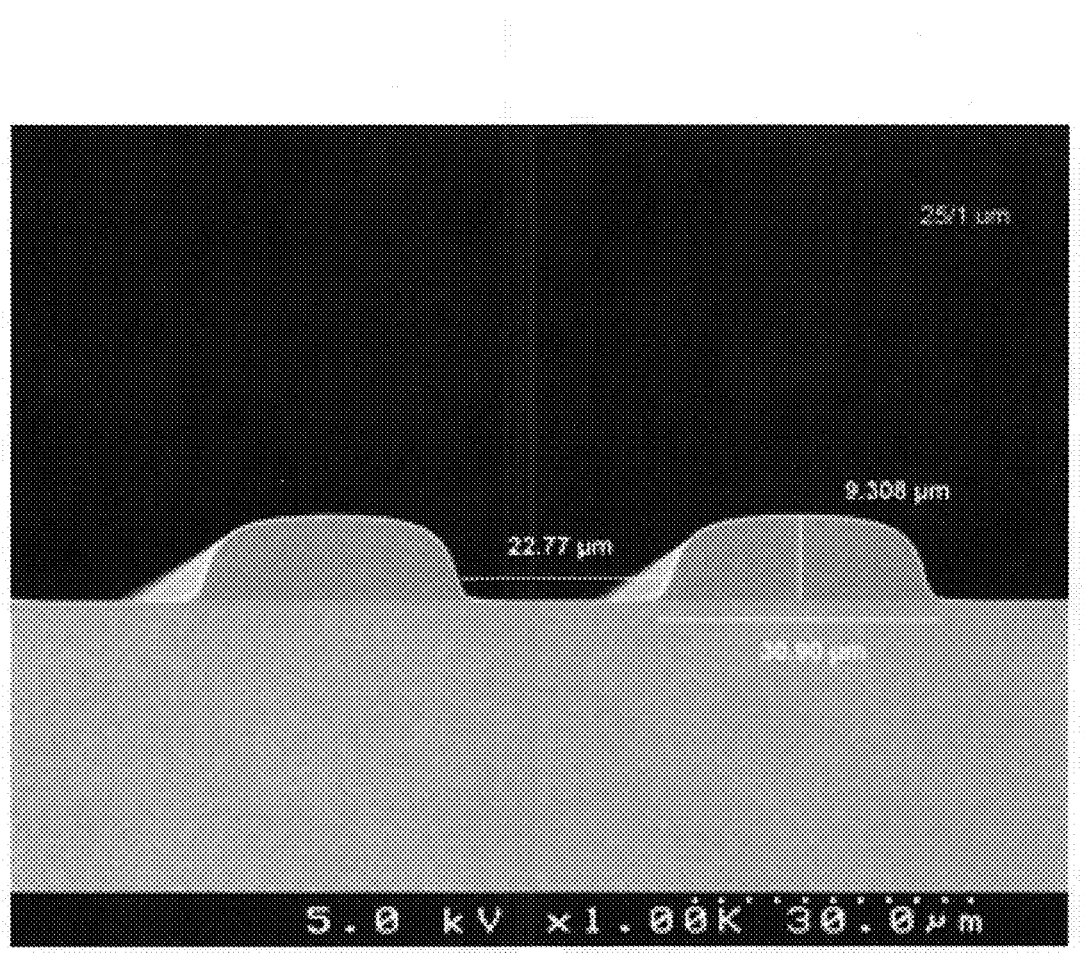
FIG. 1 shows the scanning electron micrograph (SEM) of a negative tone photo image formed from a composition embodiment of this invention.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "~~~" denotes a position at which the bonding takes place with another repeat unit or another atom or molecule or group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1-C_6)$alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "$(C_1-C_4)$alkoxy", "$(C_1-C_4)$thioalkyl", "$(C_1-C_4)$alkoxy$(C_1-C_4)$alkyl", "hydroxy$(C_1-C_4)$alkyl", "$(C_1-C_4)$alkylcarbonyl", "$(C_1-C_4)$alkoxycarbonyl$(C_1-C_4)$alkyl", "$(C_1-C_4)$alkoxycarbonyl", "amino$(C_1-C_4)$alkyl", "$(C_1-C_4)$alkylamino", "$(C_1-C_4)$alkylcarbamoyl$(C_1-$ $C_4$)alkyl", "($C_1$-$C_4$)dialkylcarbamoyl($C_1$-$C_4$)alkyl", "mono- or di-($C_1$-$C_4$)alkylamino($C_1$-$C_4$)alkyl", "amino($C_1$-$C_4$)alkylcarbonyl", "diphenyl($C_1$-$C_4$)alkyl", "phenyl($C_1$-$C_4$)alkyl", "phenylcarbonyl($C_1$-$C_4$)alkyl" and "phenoxy($C_1$-$C_4$)alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "($C_2$-$C_6$)alkenyl" includes ethenyl and straight-chained or branched propenyl, butenyl, pentenyl and hexenyl groups. Similarly, the expression "($C_2$-$C_6$)alkynyl" includes ethynyl and propynyl, and straight-chained or branched butynyl, pentynyl and hexynyl groups.

As used herein the expression "($C_1$-$C_4$)acyl" shall have the same meaning as "($C_1$-$C_4$)alkanoyl", which can also be represented structurally as "R—CO—," where R is a ($C_1$-$C_3$)alkyl as defined herein. Additionally, "($C_1$-$C_3$)alkylcarbonyl" shall mean same as ($C_1$-$C_4$)acyl. Specifically, "($C_1$-$C_4$)acyl" shall mean formyl, acetyl or ethanoyl, propanoyl, n-butanoyl, etc. Derived expressions such as "($C_1$-$C_4$)acyloxy" and "($C_1$-$C_4$)acyloxyalkyl" are to be construed accordingly.

As used herein, the expression "($C_1$-$C_6$)perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "($C_1$-$C_6$)perfluoroalkoxy", is to be construed accordingly. It should further be noted that certain of the alkyl groups as described herein, such as for example, "($C_1$-$C_6$) alkyl" may partially be fluorinated, that is, only portions of the hydrogen atoms in said alkyl group are replaced with fluorine atoms and shall be construed accordingly.

As used herein, the expression "($C_6$-$C_{10}$)aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "($C_6$-$C_{10}$)arylsulfonyl," is to be construed accordingly.

As used herein, the expression "($C_6$-$C_{10}$)aryl($C_1$-$C_4$) alkyl" means that the ($C_6$-$C_{10}$)aryl as defined herein is further attached to ($C_1$-$C_4$)alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $C_{1-6}$alkyl, $C_{2-6}$alkenyl, $C_{1-6}$perfluoroalkyl, phenyl, hydroxy, —$CO_2H$, an ester, an amide, $C_1$-$C_6$alkoxy, $C_1$-$C_6$thioalkyl, $C_1$-$C_6$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof. Similarly, microelectromechanical systems (MEMS) include microoptoelectromechanical systems (MOEMS).

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imagable compositions" will be understood to mean a material that is photodefinable and can thus provide patterned layers and/or structures after direct image-wise exposure of a film formed thereof followed by development of such images in the film using an appropriate developer.

It will be understood that the terms "dielectric" and "insulating" are used interchangeably herein. Thus reference to an insulating material or layer is inclusive of a dielectric material or layer and vice versa. Further, as used herein, the term "organic electronic device" will be understood to be inclusive of the term "organic semiconductor device" and the several specific implementations of such devices such as the organic field effect transistors (OFETs).

As used herein, the term "photobase generator" (PBG) and similar terms, such as, "photo activated base generator" and "photo initiator" means any material which when exposed to suitable radiation generates one or more bases.

By the term "derived" is meant that the polymeric repeating units are polymerized (formed) from, for example, polycyclic norbornene-type monomers (or the olefinic monomers of formula (II)), in accordance with formulae (I) or maleic anhydride type monomers of formula (III) wherein the resulting polymers are formed by 2,3 enchainment of norbornene-type monomers with maleic anhydride type monomers in an alternating fashion as shown below:

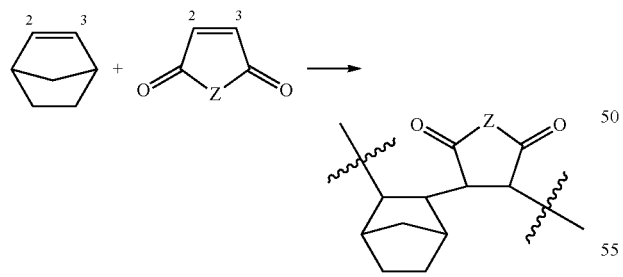

It should be understood that depending upon the monomeric compositions in a given polymer the repeat units may not always be alternating. That is to say, for example, in a copolymer containing other than 50:50 molar ratios of norbornene-type monomers with maleic anhydride monomers, the repeat units are not always alternating but with random blocks of monomers with the higher molar content.

Accordingly, in accordance with the practice of this invention there is provided photoimagable composition encompassing:

a) a polymer having one or more first type of repeating units represented by formula (IA), said first type of repeating unit is derived from a monomer of formula (I):

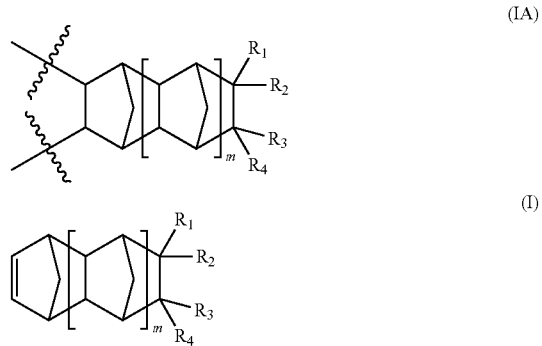

wherein:

m is an integer 0, 1 or 2;

$R_1$, $R_2$, $R_3$ and $R_4$ are the same or different and each independently represents hydrogen, halogen, a hydrocarbyl or halohydrocarbyl group selected from linear or branched $(C_1\text{-}C_{12})$alkyl, hydroxy$(C_1\text{-}C_{12})$alkyl, perfluoro$(C_1\text{-}C_{12})$alkyl, $(C_3\text{-}C_{12})$cycloalkyl, $(C_6\text{-}C_{12})$bicycloalkyl, $(C_1\text{-}C_{14})$tricycloalkyl, $(C_6\text{-}C_{10})$aryl, $(C_6\text{-}C_{10})$aryl$(C_1\text{-}C_6)$alkyl, perfluoro$(C_6\text{-}C_{10})$aryl, perfluoro$(C_6\text{-}C_{10})$aryl$(C_1\text{-}C_3)$alkyl, $(C_5\text{-}C_{10})$heteroaryl, $(C_5\text{-}C_{10})$heteroaryl$(C_1\text{-}C_3)$alkyl, hydroxy, $(C_1\text{-}C_{12})$alkoxy, $(C_3\text{-}C_{12})$cycloalkoxy, $(C_6\text{-}C_{12})$bicycloalkoxy, $(C_7\text{-}C_{14})$tricycloalkoxy, $(C_6\text{-}C_{10})$aryloxy$(C_1\text{-}C_3)$alkyl, $(C_5\text{-}C_{10})$heteroaryloxy$(C_1\text{-}C_3)$alkyl, $(C_6\text{-}C_{10})$aryloxy, $(C_5\text{-}C_{10})$heteroaryloxy, $(C_1\text{-}C_6)$acyloxy, $-(CH_2)_a-C(CF_3)_2$ OR, $-(CH_2)_a-CO_2R$, a group of formula (A):

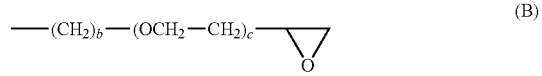

a group of formula (B):

wherein:

a is an integer from 0 to 4 b is an integer from 0 to 10;

c is an integer 0, 1, 2, 3 or 4; and

R is hydrogen, linear or branched $(C_1\text{-}C_6)$alkyl, $(C_5\text{-}C_8)$cycloalkyl, $(C_6\text{-}C_{10})$aryl or $(C_7\text{-}C_{12})$aralkyl;

and/or a second type of repeating unit represented by formula (IIA), said second type of repeating unit is derived from a monomer of formula (II):

(IIA)

-continued

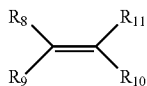
(II)

wherein $R_8$, $R_9$, $R_{10}$ and $R_{11}$ are the same or different and each independently of one another is selected from hydrogen, linear or branched $(C_1-C_6)$alkyl, $(C_5-C_8)$cycloalkyl, $(C_6-C_{10})$aryl and $(C_7-C_{12})$aralkyl; and a third type of repeating unit represented by formula (IIIA) or (IIIB), said second type of repeating unit is derived from a monomer of formula (III):

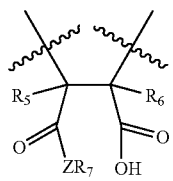
(IIIA)

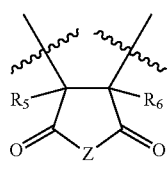
(IIIB)

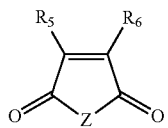
(III)

wherein:

Z is O or N—$R_{12}$ wherein $R_{12}$ is hydrogen or linear or branched $(C_1-C_9)$alkyl, $(C_3-C_7)$cycloalkyl and $(C_6-C_{12})$aryl;

$R_5$, $R_6$ and $R_7$ are each independently of one another selected from hydrogen, linear or branched $(C_1-C_9)$alkyl, fluorinated or perfluorinated$(C_1-C_9)$alkyl, $(C_6-C_{12})$aryl and $(C_6-C_{12})$aryl$(C_1-C_{12})$alkyl; and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, acetoxy, phenyl, hydroxyphenyl and acetoxyphenyl;

b) a photobase generator; and d) a carrier solvent.

The polymers employed in the photoimagable compositions of this invention can be synthesized by any of the procedures known to one skilled in the art. Generally, such polymers are prepared by free radical polymerization. See for example, U.S. Pat. No. 8,715,900, which discloses ring-opened maleic anhydride polymers with alcohols (ROMA) and copolymerized with a variety of norbornene monomers as described herein, pertinent portions of which are incorporated herein by reference. Also, see copending U.S. patent application Ser. No. 14/477,928, filed Sep. 5, 2014, which further discloses various ring-opened maleic anhydride polymers with amines (ROMI) and copolymerized with a variety of norbornene monomers as described herein, pertinent portions of which are incorporated herein by reference. Various other types of polymers containing norbornene repeat units as employed herein can also be prepared by vinyl addition polymerization using transition metal catalysts, such as for example, nickel or palladium. See for example, U.S. Pat. Nos. 5,929,181; 6,455,650; 6,825,307; and 7,101,654; pertinent portions of which are incorporated herein by reference.

In general, the polymer embodiments in accordance with the present invention encompass the above described one or more of the first distinct type of repeating units of formula (IA) in combination with the repeating unit of formula (IIIA) or (IIIB), as it will be seen below, various repeating units encompassed by such polymer embodiments are selected to provide properties to such polymer embodiments that are appropriate and desirable for the use for which such embodiments are directed, thus such polymer embodiments are tailorable to a variety of specific applications.

For example, polymer embodiments generally require at least one repeating unit directed to providing imageability. Thus distinct types of repeating units, represented by structural formula (IA) can be used as defined hereinabove, such as, for example $R_1$ being a phenethyl group. However, any of the other functional group which would bring about similar result can also be used instead, for example, a phenyl, benzyl or a substituted phenyl, and the like. Furthermore, the repeat units of formula (IIIA), which contains a carboxylic acid pendent group are generally useful for participating in a reaction with appropriately selected additives, or other repeating units that can lead to fix a negative-tone image during exposure to a suitable radiation and further cured by post exposure baking conditions as further explained below. Advantageously, same composition can also be used for fixing a positive-tone image post exposure thermal crosslinking as further explained below. It should further be noted that one of skill in the art readily appreciates that such polymer compositions containing acidic pendent groups can be made post polymerization by utilizing appropriate monomers. For example, a copolymer containing repeat units of formula (IIIB) are formed first, which is subsequently reacted with suitable alcohol or amine to form the copolymers containing the carboxylic acid pendent groups by any of the known procedures in the art. Thus certain residual amount of the anhydride monomeric repeat units of formula (IIIB) may always be present in the polymer employed herein.

Advantageously, it has further been found that the polymers employed in the compositions of this invention can also contain a second type of repeat units of formula (IIA) along with repeat units of formula (IA) and in combination with repeat units of formula (IIIA) and (IIIB). In some embodiments, the polymers of this invention contain only repeat units of formula (IA) in combination with repeat units of formula (IIIA) and (IIIB). In some other embodiments, the polymers of this invention contain only repeat units of formula (IIA) in combination with repeat units of formula (IIIA) and (IIIB). Accordingly, all such combinations of repeat units are within the scope of this invention.

In general, the polymers employed herein are copolymers containing 50:50 molar ratio of repeat units of formula (IA) or repeat units of formula (IIA) and a combination of repeat units of formula (IIIA) and (IIIB). However, in some embodiments the polymers of this invention may contain 50:50 molar ratio of combination of repeat units of formula (IA) and (IIA) in combination with repeat units of formula (IIIA) and (IIIB). That is to say that, generally, the polymer encompasses equal moles of repeat units of formula (IA) or (IIA) and combined repeat units of formulae (IIA) and (IIB). In other words, when more than one type of norbornene monomers are used to make the polymer used in the composition embodiment of this invention, then the total moles of the norbornene derived repeat units are same as the total moles of the maleic anhydride derived repeat units (i.e., combined moles of formulae (IIIA) and (IIIB). Similarly, when more than one type of monomers of formula (II) are used to make the polymer used in the composition embodiment of this invention, then the total moles of the derived repeat units of formula (IIA) are same as the total moles of the maleic anhydride derived repeat units (i.e., combined moles of formulae (IIIA) and (IIIB). Thus, generally, the polymers employed herein feature alternating repeat units of norbornene (or other olefinic repeat unit of formula (IIA) and maleic anhydride units. However, it is also possible that more molar ratios of norbornene type units can be employed to make certain polymers where the excess norbornene repeat units may exist together, such as for example, polymers containing 60:40, 70:30 or 80:20 mole ratio of norbornene to maleic anhydride. Similarly, it is also possible that there may be excess maleic anhydride derived repeat units, such as for example, 40:60, 30:70 or 20:80 mole ratio of norbornene to maleic anhydride. All such combination of polymers can be employed in the composition of this invention.

In general, it has now been found that a polymer containing the monomer repeat unit having an acidic pendent group (generally of formula (IIIA), where Z is O and $R_7$ is hydrogen or Z is $N-R_{12}$ and $R_7$ is hydrogen) advantageously provides certain beneficial effect for the photosensitive composition of this invention. Thus, in some embodiments of this invention, the polymer used in the photosensitive composition of this invention contains a monomer repeat unit containing the acid pendent group from about 10 to 50 mol %, and in some other embodiments from 20 to 40 mol %. In some other embodiments the molar percent of the monomer repeat units of formula (IIIA), where Z is O and $R_7$ is hydrogen (that means completely ring opened and hydrolyzed), in the polymer may be from about 10 to 50 mol %, from about 20 to 45 mol % and in some other embodiments from about 30 to 40 mol %. In some other embodiments the molar percent of norbornene type monomer repeat units of formula (IA) in the polymer may be from about 50 to 60 mol %.

Accordingly, any of the known monomers of formula (I) can be employed in this aspect of the invention. Representative examples of monomers of formula (I) include the following without any limitations:

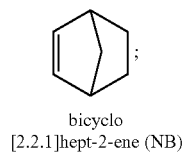

bicyclo
[2.2.1]hept-2-ene (NB)

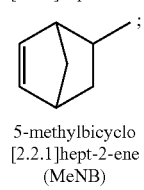

5-methylbicyclo
[2.2.1]hept-2-ene
(MeNB)

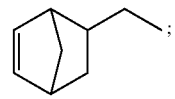

5-ethylbicyclo[2.2.1]
hept-2-ene (EtNB)

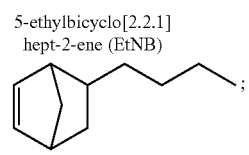

5-n-butylbicyclo[2.2.1]hept-
2-ene (BuNB)

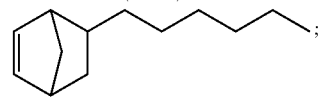

5-hexylbicyclo[2.2.1]hept-2-ene
(HexNB)

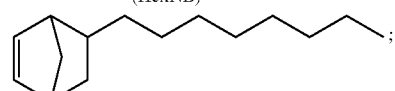

5-octylbicyclo[2.2.1]hept-2-ene (OctNB)

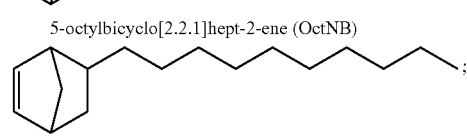

5-decylbicyclo[2.2.1]hept-2-ene (DecNB)

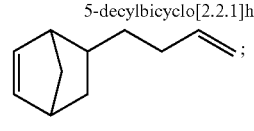

5-(but-3-en-1-yl)bicyclo[2.2.1]
hept-2-ene (1-ButenylNB)

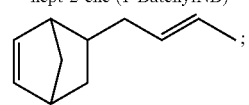

5-(but-2-en-1-yl)bicyclo[2.2.1]
hept-2-ene (2-ButenylNB)

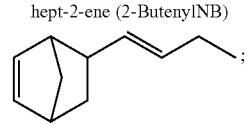

5-(but-1-en-1-yl)bicyclo[2.2.1]
hept-2-ene (3-ButenylNB)

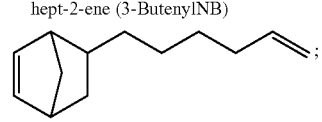

5-(hex-5-en-1-yl)bicyclo[2.2.1]hept-2-
ene (HexenylNB)

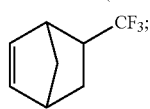

5-trifluoromethylbicyclo
[2.2.1]hept-2-ene
($CF_3NB$)

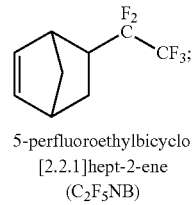

5-perfluoroethylbicyclo
[2.2.1]hept-2-ene
($C_2F_5NB$)

-continued

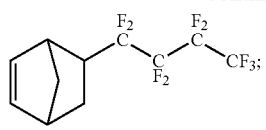

5-n-perfluorobutylbicyclo
[2.2.1]hept-2-ene ($C_4F_9NB$)

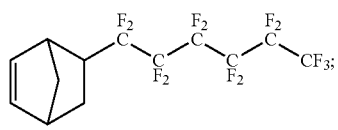

5-perfluorohexylbicyclo[2.2.1]
hept-2-ene ($C_6F_{13}NB$)

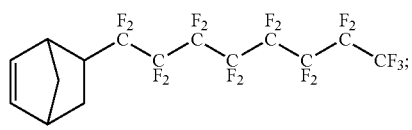

5-perfluorooctylbicyclo[2.2.1]hept-2-ene ($C_8F_{17}NB$)

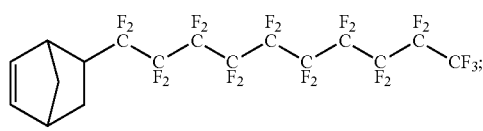

5-perfluorodecylbicyclo[2.2.1]hept-2-ene ($C_{10}F_{21}NB$)

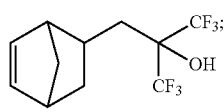

norbornenyl-2-
trifluoromethyl-3,3-
trifluoropropan-2-ol
(HFANB)

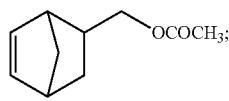

bicyclo[2.2.1]hept-5-
en-2-ylmethyl
acetate (MeOAcNB)

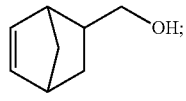

bicyclo[2.2.1]
hept-5-en-2-
ylmethanol
(MeOHNB)

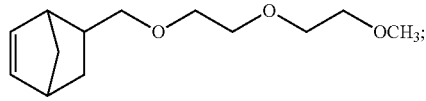

5-((2-(2-methoxyethoxy)ethoxy)methyl)bicyclo
[2.2.1]hept-2-ene (NBTON)

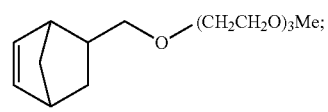

1-(bicyclo[2.2.1]hept-5-en-2-yl)-2,5,8,11-
tetraoxadodecane (NBTODD)

-continued

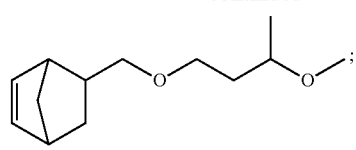

5-(3-methoxybutoxy)methyl-2-norbornene
(NB-3-MBM)

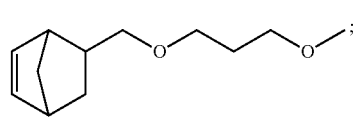

5-(3-methoxypropanoxy)methyl-2-
norbornene (NB-3-MBM)

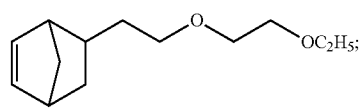

5-(2-(2-ethoxyethoxy)ethyl)bicyclo[2.2.1]
hept-2-ene

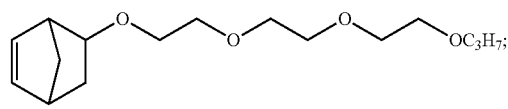

5-(2-(2-(2-propoxyethoxy)ethoxy)ethoxy)bicyclo[2.2.1]hept-
2-ene

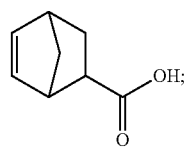

bicyclo[2.2.1]hept-5-
ene-2-carboxylic acid
(Acid NB)

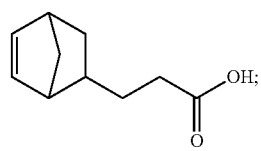

3-(bicyclo[2.2.1]hept-5-ene-2-
yl)propanoic acid (NBEtCOOH)

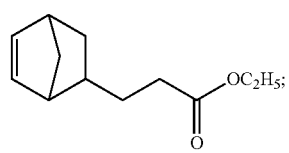

ethyl 3-(bicyclo[2.2.1]hept-5-
ene-2-yl)propanoate (EPEsNB)

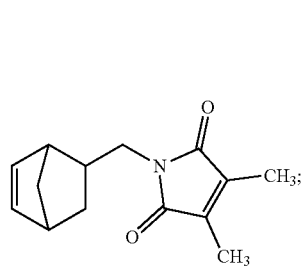

1-(bicyclo[2.2.1]hept-5-en-2-
ylmethyl)-3,4-dimethyl-1H-
pyrrole-2,5-dione (MeDMMINB)

-continued

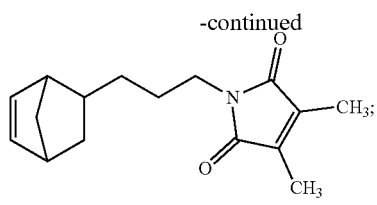

1-(3-(bicyclo[2.2.1]hept-5-en-2-yl)propyl)-
3,4-dimethyl-1H-
pyrrole-2,5-dione (PrDMMINB)

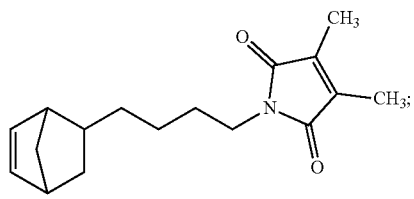

1-(4-(bicyclo[2.2.1]hept-5-en-2-yl)butyl)-3,4-
dimethyl-1H-
pyrrole-2,5-dione (BuDMMINB)

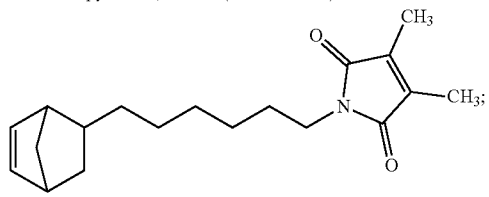

1-(6-(bicyclo[2.2.1]hept-5-en-2-yl)hexyl)-3,4-dimethyl-1H-
pyrrole-2,5-dione (HexDMMINB)

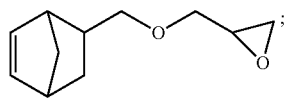

2-((bicyclo[2.2.1]hept-5-en-2-
ylmethoxy)
methyl)oxirane (MGENB)

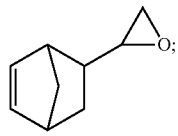

2-(bicyclo[2.2.1]
hept-5-en-2-yl)
oxirane

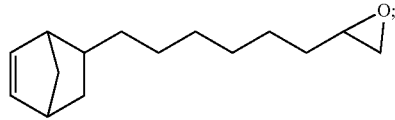

2-(6-(bicyclo[2.2.1]hept-5-en-2-yl)hexyl)
oxirane (EONB)

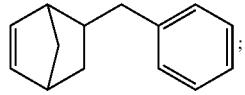

5-benzylbicyclo[2.2.1]
hept-2-ene (BenNB)

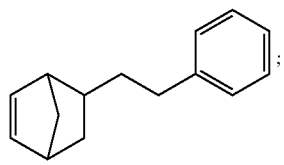

5-phenethylbicyclo[2.2.1]
hept-2-ene (PENB)

-continued

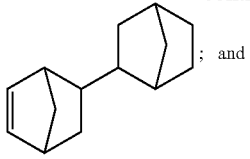

2-(bicyclo[2.2.1]hept-5-en-2-yl)
bicyclo[2.2.1]heptane
(also referred to herein as
NBNBA)

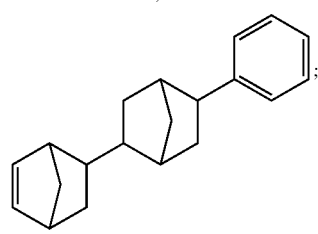

2-(bicyclo[2.2.1]hept-5-en-2-yl)-5-phenyl-
bicyclo[2.2.1]heptane
(also referred to herein as NBNBAPh)

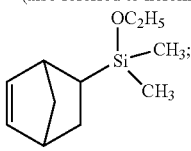

bicyclo[2.2.1]hept-5-
en-2-yl(ethoxy)
dimethylsilane
(NBSiMe$_2$(OEt)

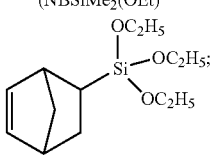

bicyclo[2.2.1]hept-5-en-2-
yl(triethoxy)silane
(TESNB)

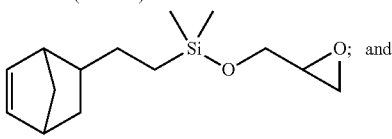

(2-(bicyclo[2.2.1]hept-5-en-2-yl)ethyl)dimethyl
(oxiran-2-ylmethoxy)silane
(NB-SiMe$_2$O-MGE

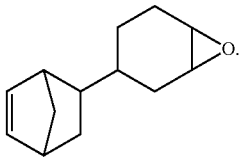

3-(bicyclo[2.2.1]hept-5-en-
2-yl)-7-oxabicyclo[4.1.0]
heptane (NBCHEp)

Turning now to second repeating unit of formula (IIA) to form the polymer for use in the composition of this invention it is contemplated that any monomer of formula (II) can be employed. Exemplary monomers of such type include but not limited to those selected from the group consisting of:
2-methylprop-1-ene;
2-methylpent-1-ene;

2,4,4-trimethylpent-1-ene;
2,4,4-trimethylpent-2-ene;
trimethyl(vinyl)silane;
styrene; and
α-methylstyrene.

Turning now to third repeating unit of formula (IIIA) or (IIIB) to form the polymer for use in the composition of this invention it is contemplated that any maleic anhydride derivative can be used as a monomer, including maleic anhydride itself. Exemplary monomers of such type include but not limited to those selected from the group consisting of:

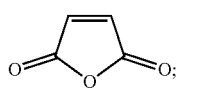

maleic anhydride

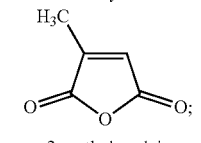

2-methyl-maleic anhydride (3-methylfuran-2,5-dione)

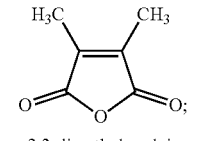

2,3-dimethyl-maleic anhydride (3,4-dimethylfuran-2,5-dione)

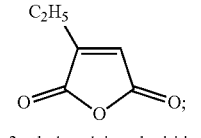

2-ethyl-maleic anhydride (3-ethylfuran-2,5-dione)

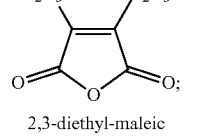

2,3-diethyl-maleic anhydride (3,4-diethylfuran-2,5-dione)

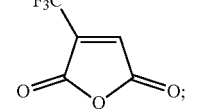

2-trifluoromethyl-maleic anhydride (3-trifluoromethylfuran-2,5-dione)

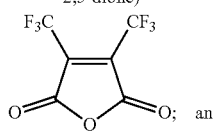
and 2,3-bis(trifluoromethyl-maleic anhydride (3,4-bis(trifluoromethyl)furan-2,5-dione)

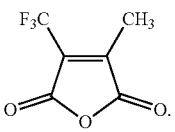

2-methyl-3-trifluoromethyl-maleic anhydride (3-methyl-4-(trifluoromethyl)furan-2,5-dione)

In a further embodiment, the composition of this invention encompasses a polymer which is a copolymer or a terpolymer containing one or more monomers of formula (I) and at least one monomer of formula (III), which results in repeat units of formula (IIIA) or (IIIB).

In another embodiment, the composition of this invention encompasses a polymer which is a copolymer or a terpolymer containing one or more monomers of formula (II) and at least one monomer of formula (III), which results in repeat units of formula (IIIA) or (IIIB).

In yet a further embodiment, the composition of this invention encompasses a polymer containing one or more monomers of formula (I), one or more monomers of formula (II) and at least one monomer of formula (III), which results in repeat units of formula (IIIA) or (IIIB).

In another embodiment the composition of this invention encompasses a polymer wherein Z is O, $R_5$ and $R_6$ are hydrogen, and $R_7$ is hydrogen or linear or branched ($C_1$-$C_9$) alkyl. That is to say that in such embodiments the polymer employed is derived from a maleic anhydride monomer which is ring opened with any of the ($C_1$-$C_9$)alcohols, including methanol, ethanol, n-propanol, isopropanol, n-butanol, iso-butanol, tert-butanol, n-pentanol, n-hexanol, n-heptyl alcohol, n-octyl alcohol, n-nonyl alcohol, and the like. However, it should be noted that any of the higher alcohols, including the cyclic alcohols can also be employed.

In another embodiment the composition of this invention encompasses a polymer wherein Z is N—$R_{12}$, $R_5$ and $R_6$ are hydrogen, $R_7$ is hydrogen and $R_{12}$ is hydrogen or linear or branched ($C_1$-$C_9$)alkyl. That is to say that in such embodiments the polymer employed is derived from a maleic anhydride monomer which is ring opened with any of the ($C_1$-$C_9$)alkyl amines, including methyl amine, ethyl amine, n-propyl amine, isopropyl amine, n-butyl amine, iso-butyl amine, tert-butyl amine, n-pentyl amine, n-hexyl amine, n-heptyl amine, n-octyl amine, n-nonyl amine, and the like.

In another embodiment, the composition of this invention encompasses a polymer derived from a monomer of formula (I) wherein m is 0, $R_1$, $R_2$, $R_3$ and $R_4$ independently represents hydrogen, hexyl, decyl, —(CH$_2$)$_2$—C(CF$_3$)$_2$OH, —(CH$_2$)$_2$—CO$_2$H, benzyl and phenethyl.

Again, any of the polymerizable monomer as described herein can be used. Thus, in one of the embodiments the polymer of this invention encompasses one or more repeat units derived from the corresponding monomers selected from the group consisting of:
bicyclo[2.2.1]hept-2-ene (NB)
5-hexylbicyclo[2.2.1]hept-2-ene (HexNB);
5-octylbicyclo[2.2.1]hept-2-ene (OctNB);
5-decylbicyclo[2.2.1]hept-2-ene (DecNB);
norbornenyl-2-trifluoromethyl-3,3,3-trifluoropropan-2-ol (HFANB);
5-n-perfluorobutylbicyclo[2.2.1]hept-2-ene (C$_4$F$_9$NB);

tetraoxadodecanenorbornene (NBTODD);
5-(3-methoxybutoxy)methyl-2-norbornene (NB-3-MBM);
5-(3-methoxypropanoxy)methyl-2-norbornene (NB-3-MPM);
5-((2-(2-methoxyethoxy)ethoxy)methyl)bicyclo[2.2.1]hept-2-ene (NBTON);
2-((bicyclo[2.2.1]hept-5-en-2-ylmethoxy)methyl)oxirane (MGENB);
2-(bicyclo[2.2.1]hept-5-en-2-yl)oxirane; and
2-(7-(bicyclo[2.2.1]hept-5-en-2-yl)hexyl)oxirane.
5-benzylbicyclo[2.2.1]hept-2-ene (BenNB);
5-phenethylbicyclo[2.2.1]hept-2-ene (PENB);
ethyl 3-(bicyclo[2.2.1]hept-2-en-2-yl)propanoate (EPEsNB),
bicyclo[2.2.1]hept-5-ene-2-carboxylic acid (Acid NB) and
norbornenylpropanoic acid (NBEtCOOH).

In yet another embodiment the polymer of this invention encompasses one or more repeat units derived from the corresponding monomers of formula (I) selected from the group consisting of:
bicyclo[2.2.1]hept-2-ene (NB);
5-decylbicyclo[2.2.1]hept-2-ene (DecNB);
norbornenyl-2-trifluoromethyl-3,3,3-trifluoropropan-2-ol (HFANB);
5-phenethylbicyclo[2.2.1]hept-2-ene (PENB); and
norbornenylpropanoic acid (NBEtCOOH).

In yet another embodiment of this invention, the composition encompasses a polymer having one or more repeat units derived from the corresponding monomers of formula (II) selected from the group consisting of:
styrene; and
α-methylstyrene.

In a further embodiment of this invention, the composition encompasses a polymer having one or more repeat units derived from the corresponding monomers of formula (III) selected from the group consisting of:
maleic anhydride; and
2-methyl-maleic anhydride.

Non-limiting examples of such copolymers or terpolymers include:
a copolymer containing repeating units derived from 5-phenethylbicyclo[2.2.1]hept-2-ene (PENB) and fully ring opened maleic anhydride repeat unit of formula (IIIA), which is ring opened with methanol, i.e., where $R_5$ and $R_6$ are hydrogen, Z is O and $R_7$ is methyl;
a copolymer containing repeating units derived from bicyclo[2.2.1]hept-2-ene (NB) and fully ring opened maleic anhydride repeat unit of formula (IIIA), which is ring opened with n-butanol, i.e., where $R_5$ and $R_6$ are hydrogen, Z is O and $R_7$ is n-butyl;
a terpolymer containing repeating units derived from 5-phenethylbicyclo[2.2.1]hept-2-ene (PENB), 5-decylbicyclo[2.2.1]hept-2-ene (DecNB) and fully ring opened maleic anhydride repeat unit of formula (IIIA), which is ring opened with methanol, i.e., where $R_5$ and $R_6$ are hydrogen, Z is O and $R_7$ is methyl; and
a copolymer containing repeating units derived from styrene and fully ring opened maleic anhydride repeat unit of formula (IIIA), which is ring opened with n-butylamine, i.e., where $R_5$ and $R_6$ are hydrogen, Z is N-n-butyl and $R_7$ is hydrogen.

The polymers employed to form the compositions of this invention generally exhibit a number average molecular weight ($M_w$) of at least about 2,000. In general, the polymers as described herein made in accordance with the free radical polymerization exhibit lower molecular weight when compared with the polymers made in accordance with the vinyl addition polymerization methods. Accordingly, in another embodiment, the polymer employed in the composition of this invention has a $M_w$ of at least about 5,000. In yet another embodiment, the polymer employed in the composition of this invention has a $M_w$ of at least about 8,000. In some other embodiments, the polymer of this invention has a $M_w$ of at least about 10,000. In some other embodiments, the polymer of this invention has a $M_w$ ranging from about 20,000 to 50,000. In some other embodiments, especially where the polymer is made by the procedures of vinyl addition polymerization techniques, the polymer of this invention has a $M_w$ of at least about 10,000. In some other embodiments, such vinyl addition polymers employed in this invention has a $M_w$ ranging from about 50,000 to 500,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Advantageously, the photobase generator used in the composition embodiments in accordance with the present invention, generates a base upon exposure to suitable radiation, where the generated base causes crosslinking of the polymer by itself or with other additives, such as crosslinking agents as further described hereinbelow, thereby causing the images to fix.

Accordingly, any of the known photobase generators can be employed in the compositions of this invention which would bring about the above intended change. Broadly, such examples of photobase generators include without any limitation various carbamates that decompose upon exposure to suitable radiation releasing an amine, and various amine derivatives and suitable amine salts, among others. Other photobase generators that can be employed include a carboxylic acid or a functional equivalent derivative thereof of an amine or its equivalent, which when exposed to a suitable radiation decomposes to release the free base. All of such compounds as single component or mixtures in any combination thereof can be used in the composition of this invention.

Illustrative examples of such photobase generators, without any limitation may be enumerated as follows.
a compound of formula (IV):

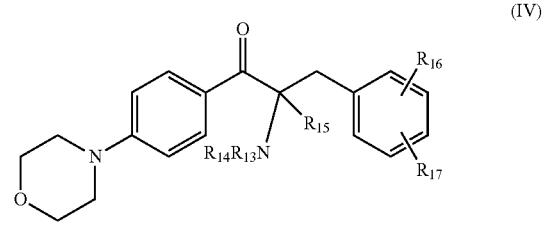

(IV)

a compound of formula (V):

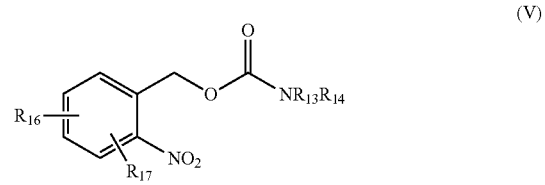

(V)

a compound of formula (VI):

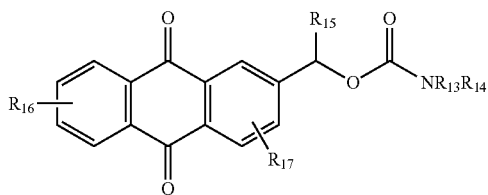

(VI)

a compound of the formula (VIIA), (VIIB) or (VIIC):

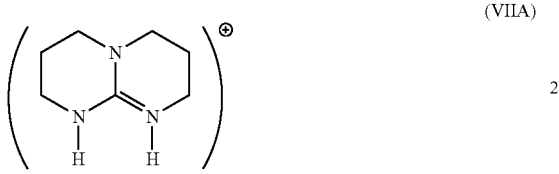

(VIIA)

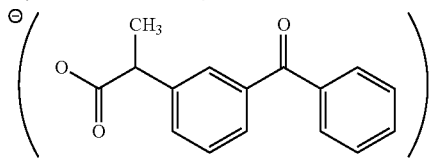

(VIIB)

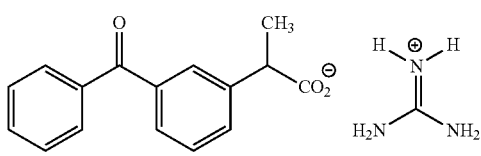

(VIIC)

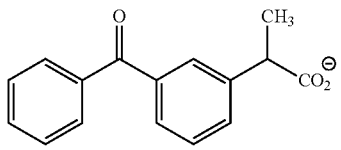

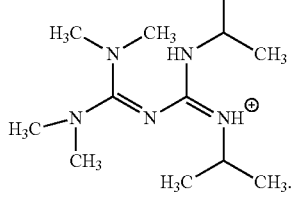

wherein $R_{13}$ and $R_{14}$ each independently of each other selected from hydrogen, linear or branched $(C_1\text{-}C_8)$alkyl and $(C_6\text{-}C_{10})$aryl, or $R_{13}$ and $R_{14}$ taken together with the nitrogen atom to which they are attached form a 5 to 7 membered monocyclic ring or 6 to 12 membered bicyclic ring, said ring optionally containing one or more heteroatoms selected from O and N, and said ring optionally substituted with linear or branched $(C_1\text{-}C_8)$alkyl, $(C_6\text{-}C_{10})$aryl, halogen, hydroxy, linear or branched $(C_1\text{-}C_8)$alkoxy and $(C_6\text{-}C_{10})$ aryloxy; and $R_{15}$, $R_{16}$ and $R_{17}$ are the same or different and each independently of one another is selected from hydrogen, linear or branched $(C_1\text{-}C_{16})$alkyl, $(C_6\text{-}C_{10})$aryl, $(C_6\text{-}C_{10})$aryl $(C_1\text{-}C_3)$alkyl, hydroxy, halogen, linear or branched $(C_1\text{-}C_{12})$ alkoxy and $(C_6\text{-}C_{10})$aryloxy.

As defined herein $R_{13}$ and $R_{14}$ taken together with the nitrogen atom to which they are attached form a 5 to 7 membered monocyclic ring or 6 to 12 membered bicyclic ring in any of the aforementioned compounds of formulae (IV) to (VI). Such 5 to 7 membered monocyclic rings or 6 to 12 membered bicyclic rings include any of the known "heteroaryl" or "heterocycle" rings as particularly defined hereinabove without any limitation.

In some embodiments the composition of this invention encompasses a photobase generator of formula (IV) wherein $R_{13}$ and $R_{14}$ are independently of each other hydrogen, methyl or ethyl, $R_{15}$ is hydrogen, methyl or ethyl, and $R_{16}$ and $R_{17}$ are independently of each other hydrogen, methyl and ethyl.

Specific examples of the photobase generators within the scope of compounds of formula (IV), (V), (VI), including specific compounds (VIIA), (VIIB) and (VIIC), that can be employed in the composition embodiments of this invention are selected from the following group without any limitation:

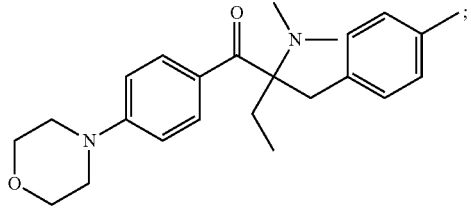

2-benzyl-2-(dimethylamino)-1-(4-morpholinophenyl) butan-1-one, commercially available as IRGACURE ® 369 from BASF

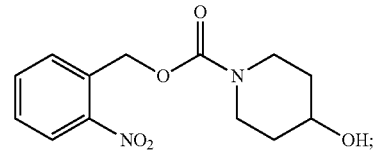

2-(dimethylamino)-2-(4-methylbenzyl)-1-(4-morpholinophenyl)butan-1-one, commercially available as IRGACURE ® 379 from BASF

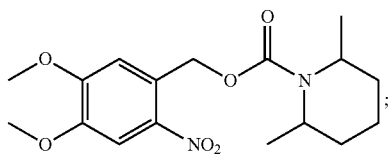

2-nitrobenzyl 4-hydroxypiperidine-1-carboxylate, commercially available as WPBG-158 from Wako Pure Chemical Industries, Ltd., Japan

4,5-dimethoxy-2-nitrobenzyl 2,6-dimethylpiperidine-1-carboxylate

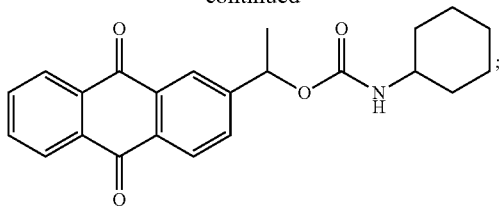

1-(9,10-dioxo-9,10-dihydroanthracen-2-yl)ethyl cyclohexylcarbamate, commercially available from Wako Pure Chemical Industries, Ltd., Japan

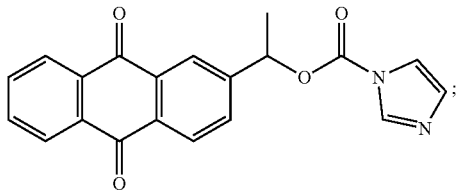

1-(9,10-dioxo-9,10-dihydroanthracen-2-yl)ethyl 1H-imidazole-1-carboxylate, also known as 1-(anthraquinon-2-yl)ethyl imidazolecarboxylate, commercially available as WPBG-140 from Wako Pure Chemical Industries, Ltd., Japan 3,4,6,7,8,9-hexahydro-2H-pyrimido[1,2-a]pyrimidin-1-ium 2-(3-benzoylphenyl)propanoate (VIIA), also known as 1,5,7-triaza-bicyclo[4.4.0]dec-5-enium 2-(3-benzoylphenyl)propanoate (commercially available as PT-393);

diaminomethaniminium 2-(3-benzoylphenyl)propanoate (VIIB), also known as guanidinium 2-(3-benzoylphenyl)propionate, commercially available as WPBG-82 from Wako Pure Chemical Industries, Ltd., Japan; and (Z)—N-(((bis(dimethylamino)methylene)amino)(isopropylamino)methylene)propan-2-aminium 2-(3-benzoylphenyl)propanoate (VIIC), commercially available as WPBG-266 from Wako Pure Chemical Industries, Ltd., Japan.

Various other known PBGs can also be used in the compositions of this invention which bring about the desirable change upon exposure to suitable radiation, such as ultraviolet or visible radiation. Such further examples of PBGs include α-amino acetophenone compound, an oxime ester compound and a compound having a substituent such as an acyloxyimino group, a N-formylated aromatic amino group, a N-acylated aromatic amino group, a nitrobenzylcarbamate group and an alkoxybenzylcarbamate group. Specific examples of such PBGs may further include 9-anthrylmethyl N,N'-diethylcarbamate (available commercially as WPBG-018 from Wako Pure Chemical Industries, Ltd., Japan) and (E)-1-[3-(2-hydroxyphenyl)-2-propenoyl]piperidine (available commercially as WPBG-027 from Wako Pure Chemical Industries, Ltd., Japan).

The amount of PBG useful in composition embodiments in accordance with the present invention is any amount that generates an effective amount of base to initiate the cross-linking reaction, such amount can thus be referred to as an effective amount. For some embodiments, such amount is from 2 to 15 pphr inclusive, based on the weight of the polymer; in other embodiments from 4 to 10 pphr inclusive and in still other embodiments, from 6 to 8 pphr inclusive. It will be understood, that for some embodiments of the present invention, it can be advantageous to employ a mixture of PBGs where the effective amount of such mixture is inclusive of the ranges expressed above.

Any of the solvents that can dissolve all of the components of the composition of this invention can be used as a carrier solvent. Representative examples of such solvents include alcohols, such as ethanol, isopropanol, butanols, and the like. Ketone solvents, such as acetone, methyl ethyl ketone (MEK), methyl amyl ketone (MAK), cyclohexanone, cyclopentanone, and the like. Hydrocarbon solvents, such as decane, toluene, p-menthane, and the like. Ester solvents, such as benzyl acetate, ethyl acetate, and the like. Glycol and ether solvents, such as diethylene glycol dimethyl ether, propylene glycol monomethyl ether (PGME), propylene glycol monomethyl ether acetate (PGMEA), and the like. Various other solvents, such as N-methyl-2-pyrrolidone (NMP), gamma-butyrolactone (GBL), N,N-dimethylacetamide, N,N-dimethylformamide (DMF), anisole, methyl 3-methoxypropionate, tetrahydrofuran (THF), 3-ethoxy-1,1,1,2,3,4,4,5,5,6,6,6-dodecafluoro-2-(trifluoromethyl)hexane (HFE-7500), 1,1,1,2,2,3,3,4,4-nonafluoro-4-methoxybutane, 1,1,1,2,2,3,4,4,4-nonafluoro-3-methoxybutane and mixtures in any combination thereof.

As noted, PBGs generally absorb actinic radiation over a broad range of wavelengths while in modern photoexposure tools, a limited range of wavelengths or even a single wavelength, is provided. Therefore, in addition to a PBG, a photosensitizer can be included within the polymer composition where such material is selected to be absorbing at a wavelength(s) used for the image-wise exposure. While any appropriate photosensitizer can be employed, a useful photosensitizer for exposure at wavelengths that include 248 nanometers includes CPTX of the formula:

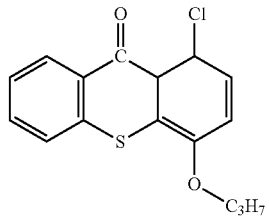

1-chloro-4-propoxy-1,9a-dihydro-9H-thioxanthen-9-one (CPTX, commercially available from Lambson Fine Chemicals)

In addition, various other additives/components can be added to the composition of this invention, which is used for the formation of the photoimagable layer such that its mechanical and other properties can be tailored as desired. Also, other additives can be used to alter the processability, which include increase the stability of the polymer to thermal and/or light radiation. In this regard, the additives can include, but are not limited to, crosslinking agents, antioxidants, adhesion promoters, and the like. Non-limiting examples of such compounds are selected from the group consisting of the following, commercially available materials are indicated by such commercial names.

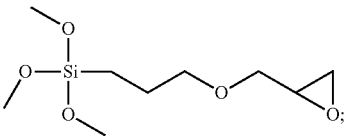

trimethoxy(3-(oxiran-2-ylmethoxy)propyl)silane, also commonly known as 3-glycidoxypropyl trimethoxysilane (KBM-403 from Shin-Etsu Chemical Co., Ltd.)

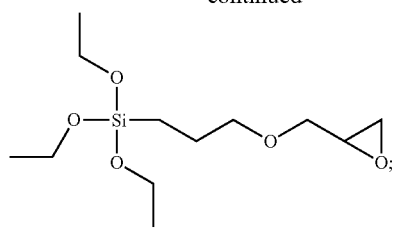

triethoxy(3-(oxiran-2-ylmethoxy)propyl)silane,
also commonly known as 3-glycidoxypropyl
triethoxysilane (KBE-403
from Shin-Etsu Chemical Co., Ltd.)

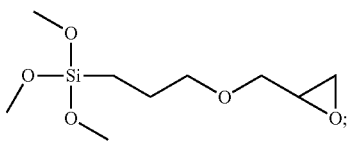

trimethoxy(3-(oxiran-2-ylmethoxy)propyl)silane,
also commonly known as 3-glycidoxypropyl
trimethoxysilane (3-GTS)

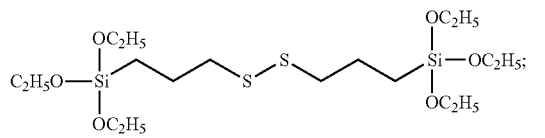

((triethoxysilyl)propyl)disulfide (Si-75 or Si-266 from Evonik)

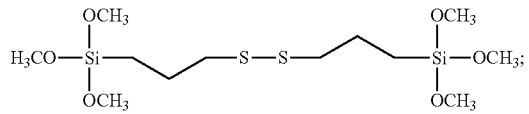

((trimethoxysilyl)propyl)disulfide

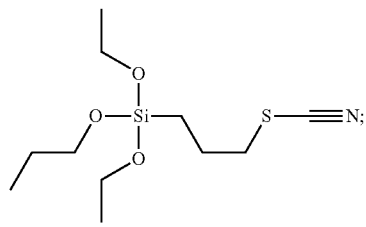

diethoxy(propoxy)(3-thiocyanatopropyl)silane,
commercially available as SIT-7908.0
from Gelest

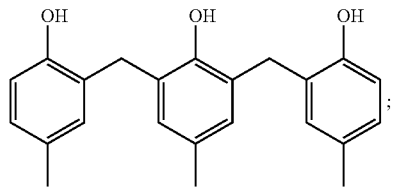

2,2'-((2-hydroxy-5-methyl-1,3-phenylene)bis
(methylene))bis(4-methylphenol)
(Antioxidant AO-80 from TCI Japan)

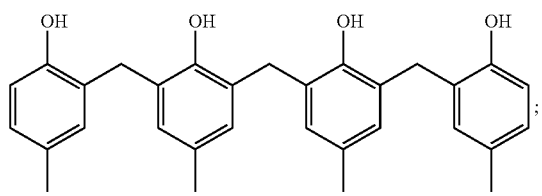

6,6'-methylenebis(2-(2-hydroxy-5-methylbenzyl)-4-
methylphenol) (4-PC)

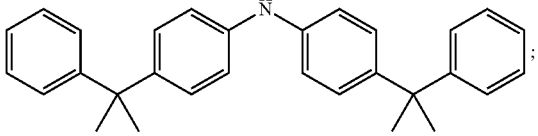

bis(4-(2-phenylpropan-2-yl)phenyl)amine, commercially
available as Naugard-445 from Addivant

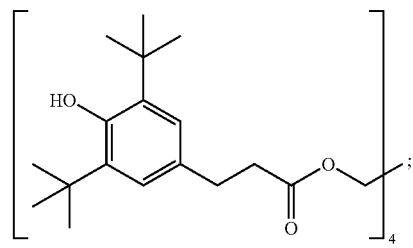

pentaerythritol tetrakis(3-(3,5-di-tert-butyl-
4-hydroxyphenyl)
propionate) (Irganox 1010 from BASF)

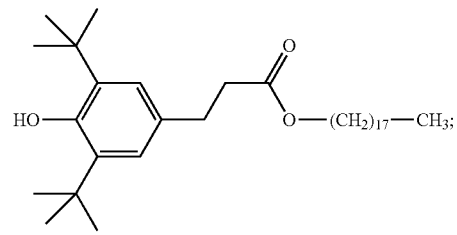

3,5-bis(1,1-dimethylethyl)-4-hydroxy-octadecyl ester
benzenepropanoic acid (Irganox 1076 from BASF)

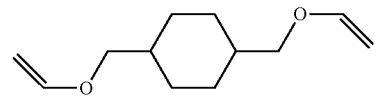

1,4-bis[(ethenyloxy)methyl]-cyclohexane
(Cyclohexane Divinyl ether (CHDVE))

Advantageously, it has now been found that the compositions of this invention contain at least one or more of the crosslinking agents. Any of the crosslinking agents known in the literature that would bring about the crosslinking of the polymer with other additives when the base is generated at a desirable temperature during the curing stage can be employed in the embodiments of the present invention. Accordingly, in some embodiments of this invention, the photosensitive composition of this invention, without any limitation, contains one or more epoxy compounds selected from the following:

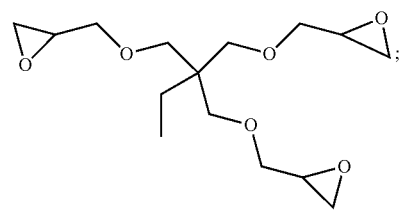

2,2'-(((2-ethyl-2-((oxiran-2-ylmethoxy)methyl)
propane-1,3-diyl)bis(oxy))bis(methylene))
bis(oxirane), (TMPTGE), commercially available
as Denacol EX-321L (Nagase)

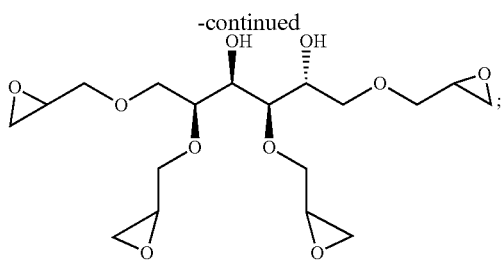

(2R,3R,4R,5S)-1,3,5,6-tetrakis(oxiran-2-ylmethoxy)hexane-2,4-diol (also known as tetrakis-o-(oxiranylmethyl)-D-glucitol) (Denacol EX-614 from Nagase)

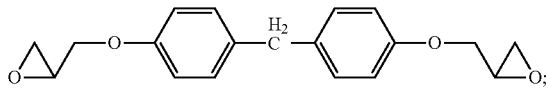

bis(4-(oxiran-2-ylmethoxy)phenyl)methane (EPON 862 ® from Momentive Specialty Chemicals Inc.)

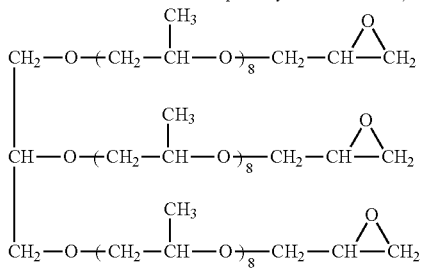

triglycidyl ether of poly(oxypropylene)epoxide ether of glycerol, commercially available as Heloxy 84 or GE-36 from Momentive Specialty Chemicals Inc.

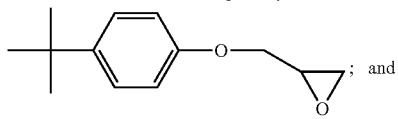

2-((4-(tert-butyl)phenoxy)methyl)oxirane, commercially available as Heloxy 65 from Momentive Specialty Chemicals Inc.

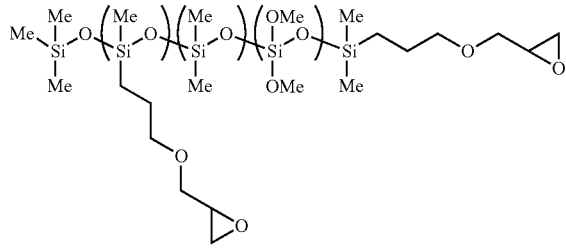

Silicone modified epoxy compound commercially available as BY16-115 from Toray-Dow Corning Silicone Co., Ltd.

Other exemplary cross-linking or crosslinkable materials that can be used as additives in the forming of a photosensitive composition of the present invention include, among others, bisphenol A epoxy resin, bisphenol F epoxy resin, silicone containing epoxy resins or the like, propylene glycol diglycidyl ether, polypropylene glycol diglycidyl ether, glycidyloxypropyltrimethoxysilane, polymethyl (glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2-oxazoline-2-yl)benzene, 2,2'-bis (2-oxazoline), 2,6-bis(4-isopropyl-2-oxazoline-2-yl)pyridine, 2,6-bis(4-phenyl-2-oxazoline-2-yl)pyridine, 2,2'-isopropylidenebis (4-phenyl-2-oxazoline), (S,S)-(-)-2,2'-isopropylidenebis (4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol and resole type phenol resin or mixtures thereof.

Any amount of epoxy compound can be employed in the photosensitive composition of this invention which brings about the desired crosslinking effect of the total composition. Generally, as noted above, such amount can range from 10 to 100 parts per hundred parts by mass (pphr) of the polymer, inclusive, as described herein. In some other embodiments such amount can range from 15 to 80 pphr, inclusive. In some other embodiments such amount can range from 40 to 60 pphr, inclusive. In some embodiments one or more of the epoxy compound as described herein is employed. In another embodiment at least two of the epoxy compounds are employed.

In another aspect of this invention there is further provided a photoimagable composition comprising:

a) a polymer having one or more repeating units of formula (IA) derived from a monomer of formula (I):

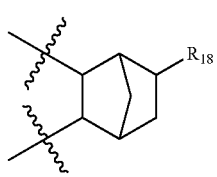

(VIIIA)

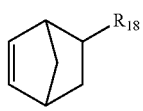

(VIII)

wherein ∿∿∿ represents a position at which the bonding takes place with another repeat unit;

$R_{18}$ is $(C_6-C_{18})$alkyl; perfluoro$(C_1-C_{18})$alkyl; $(C_6-C_{10})$aryl$(C_1-C_6)$alkyl; —$(CH_2)_a$—$C(CF_3)_2OR$, —$(CH_2)_a$—$CO_2R_2$ where a is an integer from 0 to 4, and $R_2$ is selected from hydrogen and $(C_1-C_4)$alkyl;

a group of formula (A):

—$(CH_2)_b$—$(OCH_2$—$CH_2)_c$—OR (A); and a group of formula (B):

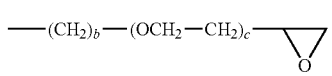

(B)

wherein:

b is an integer from 0 to 10;

c is an integer 0, 1, 2, 3 or 4; and

R is hydrogen, linear or branched $(C_1-C_6)$alkyl, $(C_5-C_8)$cycloalkyl, $(C_6-C_{10})$aryl or $(C_7-C_{12})$aralkyl;

b) a photobase generator selected from the group consisting of: a compound of formula (IV), (V), (VI), (VIIA), (VIIB) and (VIIC) as described hereinabove; and c) a carrier solvent.

In this aspect of the invention, any of the polymer encompassing one or more repeat units derived from the corresponding monomer of formula (VIII) can be used to form the composition embodiment of this invention. Specific examples of such monomer of formula (VIII), without any limitation, can be selected from the group consisting of:

norbornenyl-2-trifluoromethyl-3,3,3-trifluoropropan-2-ol (HFANB);
trioxanonanenorbornene (NBTON);
tetraoxadodecanenorbornene (NBTODD);
5-(3-methoxybutoxy)methyl-2-norbornene (NB-3-MBM);
5-(3-methoxypropanoxy)methyl-2-norbornene (NB-3-MPM);
ethyl 3-(bicyclo[2.2.1]hept-2-en-2-yl)propanoate (EPEsNB);
bicyclo[2.2.1]hept-5-ene-2-carboxylic acid (Acid NB); and
norbornenylpropanoic acid (NBEtCOOH).

In one of the embodiments encompassing this aspect of the invention the polymer is derived from the following monomers of formula (VIII):
norbornenyl-2-trifluoromethyl-3,3,3-trifluoropropan-2-ol (HFANB); and
norbornenylpropanoic acid (NBEtCOOH).

Again, any one or more of the specific PBGs as disclosed hereinabove can be employed in this aspect of the composition embodiment of this invention without any limitation.

Further, this aspect of the composition embodiment of this invention further contains one or more additives as described herein, including particularly a crosslinking agent, an antioxidant and an adhesion promoter, and various other additives as described hereinabove.

In yet another aspect of this invention there is further provided a method of forming a patterned film for the fabrication of a microelectronic or optoelectronic device comprising:
coating a suitable substrate with a composition according to this invention to form a film;
patterning the film with a mask by exposing to a suitable radiation;
developing the film after exposure to form a photopattern; and
curing the film by heating to a suitable temperature.

The coating of the desired substrate to form a film with photosensitive composition of this invention can be performed by any of the coating procedures as described herein and/or known to one skilled in the art, such as by spin coating. Other suitable coating methods include without any limitation spraying, doctor blading, meniscus coating, ink jet coating and slot coating. Suitable substrate includes any appropriate substrate as is, or may be used for electrical, electronic or optoelectronic devices, for example, a semiconductor substrate, a ceramic substrate, a glass substrate.

Next, the coated substrate is first softbaked before the curing, i.e., heated to facilitate the removal of residual casting solvent, for example to a temperature from 60° C. to 140° C. for from about 1 to 30 minutes, although other appropriate temperatures and times can be used. In some embodiments the substrate is first softbaked at a temperature of from about 100° C. to about 130° C. for 2 minutes to 10 minutes. After the heating, the film is generally imagewise exposed to an appropriate wavelength of actinic radiation, wavelength is generally selected based on the choice of the photobase generator employed in combination with the photosensitizer, if any, in the polymer composition as described hereinabove. However, generally such appropriate wavelength is that produced by a mercury vapor lamp which is from 200 to 450 nm depending upon the type of mercury vapor lamp employed. It will be understood that the phrase "imagewise exposure" means exposing through a masking element to provide for a resulting pattern of exposed and unexposed portion of the film.

After an imagewise exposure of the film formed from the composition in accordance with the present invention, a development process is employed. Advantageously, the compositions of this invention function as "positive tone" or "negative tone" compositions depending upon the type of composition employed and the intended use thereof.

As is well known in the art, in the "positive tone" compositions, for example, the development process removes only exposed portions of the film thus leaving a positive image of the masking layer in the film. That is, the film upon exposure to suitable actinic radiation becomes more soluble in a developing solvent.

Generally, suitable developers for positive tone compositions can include aqueous solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as propylene glycol methyl ether acetate (PGMEA), 2-heptanone, cyclohexanone, toluene, xylene, ethyl benzene, mesitylene and butyl acetate, among others.

Thus some embodiments of the present invention provide self-imagable films that after imagewise exposure, a resulting image is developed using an aqueous base solution. After the image is developed, the substrate is rinsed to remove excess developer solvent, typical rinse agents are water or appropriate alcohols and mixtures thereof.

After the aforementioned rinsing, the substrate is dried and the imaged film finally cured. That is to say, the image is fixed. In this step, the photobase generator present in the unexposed region of the composition may thermally decompose to release the free base, which facilitates further cross-linking reaction of the remaining polymer material. The heating is generally carried out at a desirable temperature, for example, from above 160° C. to 250° C. for a sufficient length of time, i.e., from several minutes to one or more hours. Where the remaining layer cross links with the epoxy additive as described herein. Advantageously, it has now been found that such a curing step not only helps in fixing the image, it also enhances the thermo-mechanical properties of the film.

Accordingly, in some embodiments the resulting imagewise film or layer is cured by heating the patterned and developed substrate at a temperature of from about 170° C. to about 220° C. for about 20 minutes to about 240 minutes. In some other embodiments such curing is carried out at a temperature of from about 190° C. to about 210° C. for about 30 minutes to about 180 minutes. In yet some other embodiments such curing is carried out at a temperature of from about 180° C. to about 200° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours. In some other embodiments the pattern reflow is completely absent after curing step, which means that pattern integrity is maintained, thus providing image resolution of about 10 μm. In some other embodiments the image resolution is about 5 μm.

As noted above, advantageously, the compositions of this invention are also useful as "negative tone" compositions, for example, the development process removes only unexposed portions of the film thus leaving a negative image of the masking layer in the film. That is, the film upon exposure to suitable actinic radiation becomes less soluble in a developing solvent, thus removing only the unexposed regions.

In general, the films formed from the negative tone compositions are first "image-wise" exposed to a suitable radiation, and then heated to a temperature of from about 120° C. to 15° C. for sufficient length of time to ensure that the free base generated during exposure in the exposed regions aid in crosslinking the polymer with other additives. The unexposed regions remain essentially same. Then the films are developed.

Generally, suitable developers for negative tone compositions of this invention are same as the developers used for "positive tone" compositions as described hereinabove. That is, any of the aqueous solutions of inorganic alkalis, ammonia, and aqueous solutions of organic alkalis such as 0.26N tetramethylammonium hydroxide (TMAH), and the like can be used in combination with any of the organic solvents as described hereinabove.

Thus some embodiments of the present invention provide self-imagable films that after imagewise exposure, a resulting image is developed using an aqueous base solution, which removes the unexposed regions of the film. After the image is developed, the substrate is rinsed to remove excess developer solvent, typical rinse agents are water or appropriate alcohols and mixtures thereof.

After the aforementioned rinsing, the substrate is dried and the imaged film finally cured. That is to say, the image is fixed. The heating is generally carried out at a desirable temperature, for example, from above 160° C. to 250° C. for a sufficient length of time, i.e., from several minutes to one or more hours. Where the remaining layer cross links with the epoxy additive as described herein. Advantageously, it has now been found that such a curing step not only helps in fixing the image, it also enhances the thermo-mechanical properties of the film as is apparent from the examples that follows.

Accordingly, in some embodiments the resulting imagewise film or layer is cured by heating the patterned and developed substrate at a temperature of from about 170° C. to about 220° C. for about 20 minutes to about 240 minutes. In some other embodiments such curing is carried out at a temperature of from about 190° C. to about 210° C. for about 30 minutes to about 180 minutes. In yet some other embodiments such curing is carried out at a temperature of from about 180° C. to about 200° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours. In some other embodiments the pattern reflow is completely absent after curing step, which means that pattern integrity is maintained, thus providing image resolution of about 10 μm. In some other embodiments the image resolution is about 5 μm.

Advantageously, in some embodiments of this invention, it has also been found that the image resolution can be improved in the negative tone compositions by tailoring the appropriate exposure dose. That is, depending upon the exposure dose used the image resolution is generally improved. Accordingly, in some embodiments the films are imagewise exposed to a suitable radiation at a dosage level of from about 100 mJ/cm$^2$ to 1000 mJ/cm$^2$. In some other embodiments the exposure dosage employed is from about 200 mJ/cm$^2$ to 800 mJ/cm$^2$. In some other embodiments the exposure dosage employed is at least about 250 mJ/cm$^2$. By employing suitable exposure dosage as described herein it is now possible to obtain films that exhibit lower degree of film loss after exposure. That is, generally the exposed area film thickness loss or bright field loss (BFL) of the films that exhibit negative tone (NT) image is low as measured by the film thicknesses before and after development in an exposed region of the film. Thus, in some embodiments it has now been found that the BFL loss is less than 20% by exposing the film to a higher exposure dose. In some other embodiments the BFL loss is less than 10%. It has also been observed that by increasing the exposure dosage the sidewall angle of the image can be substantially increased. That is, for example, the vias typically formed in the semiconductor fabrications retain a very high sidewall angles. Thus, in some embodiments it has now been found that the side wall angle of the image formed, for example vias, is at least 65°. In some other embodiments the side wall angle of the image formed is at least 800.

The devices are produced by using embodiments of the photosensitive resin composition of the present invention to form layers which are characterized as having improved mechanical properties, high heat resistance, an appropriate water absorption rate, high transparency, and low permittivity. In addition, such layers generally have an advantageous coefficient of thermal elasticity (CTE) after curing, high elongation to break (ETB), low wafer stress, glass transition temperature ($T_g$) higher than 100° C., among other improved properties as apparent from the examples that follows.

As previously mentioned, exemplary applications for embodiments of the photosensitive compositions in accordance with the present invention include redistribution layer, die attach adhesive, wafer bonding adhesive, insulation films (interlayer dielectric layers), protecting films (passivation layers), mechanical buffer films (stress buffer layers) or flattening films for a variety of semiconductor devices, including printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Advantageously, it has now been found that the photosensitive compositions of this invention may be useful to form adhesive layers for bonding the semiconductor chips to each other, such as in chip-stack applications. For example, a redistribution layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it may now be possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it may now be possible to form a variety of electronic devices featuring hitherto unachievable level of miniaturization, thinning and light-weight, and the function of the semiconductor device is not easily damaged even if such devices are subject to rugged operations such as swinging or dropping.

Accordingly, in some of the embodiments of this invention there is also provided a cured product obtained by curing the photosensitive composition as described herein. In another embodiment there is also provided an optoelectronic or microelectronic device comprising the cured product of this invention as described herein.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:
NB—bicyclo[2.2.1]hept-2-ene; PENB—5-phenethylbicyclo[2.2.1]hept-2-ene; HFANB—norbornenyl-2-trifluoromethyl-3,3,3-trifluoropropan-2-ol; NBEtCOOH—norbornenylpropanoic acid; DecNB—5-decylbicyclo[2.2.1]hept-2-ene; MA—maleic anhydride; PBG-1—1-(9,10-dioxo-9,10-dihydroanthracen-2-yl)ethyl cyclohexylcarbamate; PBG-2—2-nitrobenzyl 4-hydroxypiperidine-1-carboxylate; PBG-3—4,5-dimethoxy-2-nitrobenzyl 2,6-dimethylpiperidine-1-carboxylate; PBG-4—2-benzyl-2-(dimethylamino)-1-(4-morpholinophenyl)butan-1-one; PBG-5—2-(dimethylamino)-2-(4-methylbenzyl)-1-(4-morpholinophenyl)butan-1-one; PBG-6—3,4,6,7,8,9-hexahydro-2H-pyrimido[1,2-a]pyrimidin-1-ium 2-(3-benzoylphenyl)propanoate; PBG-7—1-(9,10-dioxo-9,10-dihydroanthracen-2-yl)ethyl 1H-imidazole-1-carboxylate; PBG-8—guanidinium 2-(3-benzoylphenyl)propionate; PBG-9—(Z)—N-(((bis(dimethylamino)methylene)amino) (isopropylamino)methylene)propan-2-aminium 2-(3-benzoylphenyl)propanoate; TMPTGE—2,2'-(((2-ethyl-2-((oxiran-2-ylmethoxy)methyl)propane-1,3-diyl)bis(oxy))bis (methylene))bis(oxirane); GE-36—triglycidyl ether of poly (oxypropylene)epoxide ether of glycerol; BY16-115—silicone modified epoxy compound; EPON 862—bis(4-(oxiran-2-ylmethoxy)phenyl)methane; Si-75—((triethoxysilyl)propyl)disulfide; 3-GTS—triethoxy(3-(oxiran-2-ylmethoxy)propyl)silane, also commonly known as 3-glycidoxypropyl triethoxysilane; CPTX—1-chloro-4-propoxy-1,9a-dihydro-9H-thioxanthen-9-one; KBM-403—3-glycidoxypropyl trimethoxysilane; Naugard-445—bis(4-(2-phenylpropan-2-yl)phenyl)amine; AO-80—2,2'-((2-hydroxy-5-methyl-1,3-phenylene)bis(methylene))bis(4-methylphenol); SIT-7908.0—diethoxy(propoxy)(3-thiocyanatopropyl)silane; Megaface F-556—oligomer with fluoro, hydrophilic and lipophilic group from DIC Corp.; GBL—γ-butyrolactone; PGMEA—propylene glycol methyl ether acetate; PBG—photobase generator; ROMA—ring opened maleic anhydride polymer with an alcohol; ROMI—ring opened maleic anhydride polymer with an amine; phr—parts per hundred parts resin; R. T.—room temperature; LC-MS: liquid chromatography-mass spectroscopy; GPC: gel permeation chromatography; $M_w$—weight average molecular weight; PDI—polydispersity index; phr: parts per hundred parts of resin.

The following examples describe the procedures used for the preparation of various polymers as disclosed herein in the preparation of the compositions of this invention. However, it should be noted that these examples are intended to illustrate the disclosure without limiting the scope thereof.

POLYMER EXAMPLES

The polymers used to form the photosensitive compositions of this invention are generally known in the literature and are prepared in accordance with the well-known literature procedures. See for example, the U.S. Pat. No. 8,715,900 for all synthetic procedures related to ROMA polymers and the copending U.S. patent application Ser. No. 14/477,928, filed Sep. 5, 2014 for all synthetic procedures related to ROMA polymers. Other polymers as used herein can be made in accordance with any of the other literature procedure as described particularly in U.S. Pat. Nos. 5,929,181; 6,455,650; 6,825,307; and 7,101,654.

Photoimagable Polymer Composition and Imaging Studies

The following Examples illustrate the imageability of the compositions of this invention with a variety of other components as described herein.

Example 1

A fully ring opened copolymer having the monomer composition of 50:50 molar ratio of PENB/MA ring opened with methanol ($M_w$ 8,500 and PDI 1.9, repeat units of formula (IIIA) where Z is O and $R_7$ is methyl) (100 parts resin) was dissolved in GBL (120 parts) having the specific amounts of additives, expressed as parts per hundred resin (pphr) PBG-4 (7.5 phr), CPTX (1 phr) as photosensitizer, TMPTGE (10 phr) and GE-36 (50 phr) as crosslinking agents, AO-80 (5 phr) as an anti-oxidant, Naugard-445 (5 phr), Megaface F-556 (0.3 phr) and SIT-7908.0 (3 phr) were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter under 35 psi pressure, the filtered polymer solution was collected in a low particle HDPE amber bottle and the resulting solution stored at 5° C.

Examples 2-19

Example 1 was substantially repeated in these Examples 2-19 except that the type of polymer and other additives were varied as summarized in Tables 1 to 5. GBL was used as the solvent in all of the Examples 2-19 except in Examples 8A through 8D and Example 11 the solvent employed was PGMEA. In Examples 15 to 18, 230 parts of GBL was used and in Example 19 180 parts of GBL was used.

TABLE 1

| Ingredients | Example 2 | Example 3 | Example 4 | Example 5 | Example 14 |
|---|---|---|---|---|---|
| Polymer - Amount | 100 phr | 100 phr | 100 phr | 100 phr | 100 phr |
| Polymer - Type | PENB/ROMA-MeOH | PENB/ROMA-MeOH | PENB/ROMA-MeOH | PENB/ROMA-MeOH | PENB/ROMA-MeOH |
| PBG-4 | 7.5 phr | 7.5 phr | 5 phr | 5 phr | 7.5 phr |
| CPTX | 1 phr | 1 phr | 1 phr | 1 phr | 1 phr |
| TMPTGE | 10 phr | 10 phr | 25 phr | — | — |
| BY16-115 | — | — | — | 25 phr | — |
| GE-36 | 50 phr | 50 phr | 25 phr | 25 phr | 50 phr |
| AO-80 | 5 phr | 5 phr | 5 phr | 5 phr | 5 phr |
| Naugard 445 | 5 phr | 5 phr | 5 phr | 5 phr | 5 phr |
| Megaface F-556 | 0.2 phr | 0.3 phr | — | — | 0.3 phr |
| SIT-7908.0 | 3 phr | 3 phr | 3 phr | 3 phr | 3 phr |

TABLE 2

| Ingredients | Example 6 | Example 7 |
|---|---|---|
| Polymer - Amount | 100 phr | 100 phr |
| Polymer - Type | PENB/ROMA-MeOH | PENB/ROMA-MeOH |
| PBG-4 | 5 phr | 5 phr |
| CPTX | — | 1 phr |
| TMPTGE | 40 phr | 40 phr |

TABLE 3

| Ingredients | Example 8A | Example 8B | Example 8C | Example 8D |
|---|---|---|---|---|
| Polymer - Amount | 100 phr | 100 phr | 100 phr | 100 phr |
| Polymer - Type | PENB/ROMA-MeOH | PENB/ROMA-MeOH | PENB/ROMA-MeOH | PENB/ROMA-MeOH |
| PBG | PBG-1, 5 phr | PBG-2, 5 phr | PBG-3, 5 phr | PBG-4, 5 phr |
| CPTX | 1 phr | 1 phr | 1 phr | 1 phr |
| TMPTGE | 40 phr | 40 phr | 40 phr | 40 phr |
| Megaface F-556 | 0.15 phr | 0.15 phr | 0.15 phr | 0.15 phr |
| SIT-7908.0 | 3 phr | 3 phr | 3 phr | 3 phr |

TABLE 4

| Ingredients | Example 9 | Example 10 | Example 11 | Example 12 | Example 13 |
|---|---|---|---|---|---|
| Polymer - Amount | 100 phr | 100 phr | 100 phr | 100 phr | 100 phr |
| Polymer - Type | NB/ROMA-BuOH | HFANB/NBEtCOOH | PENB/ROMA-MeOH | Sty/ROMI-BuNH$_2$ | PENB/ROMA-MeOH |
| PBG | PBG-4 | PBG-4 | PBG-6 | PBG-4 | PBG-5 |
| PBG | 5 phr | 5 phr | 5 phr | 10 phr | 7.6 phr |
| CPTX | 1 phr | 1 phr | 1 phr | — | — |
| TMPTGE | 40 phr | 40 phr | 40 phr | 40 phr | 10 phr |
| GE-36 | — | — | — | — | 50 phr |
| Megaface F-556 | 0.15 phr | 0.15 phr | 0.15 phr | — | 0.3 phr |
| SIT-7908.0 | 3 phr | 3 phr | 3 phr | — | 3 phr |

TABLE 5

| Ingredients | Example 15 | Example 16 | Example 17 | Example 18 | Example 19 |
|---|---|---|---|---|---|
| Polymer - Amount | 100 phr | 100 phr | 100 phr | 100 phr | 100 phr |
| Polymer - Type (molar ratio) | DecNB/PENB/ROMA-MeOH (20/30/50) | DecNB/PENB/ROMA-MeOH (20/30/50) | DecNB/PENB/ROMA-MeOH (20/30/50) | DecNB/PENB/ROMA-MeOH (20/30/50) | DecNB/PENB/ROMA-MeOH (20/30/50) |
| PBG | PBG-7 | PBG-8 | PBG-2 | PBG-9 | PBG-4 |
| PBG | 7.5 phr | 7.5 phr | 7.5 phr | 7.5 phr | 5 phr |
| CPTX | 2.5 phr | 2.5 phr | 2.5 phr | 2.5 phr | 1.5 phr |
| EPON-862 | 20 phr | 20 phr | 20 phr | 20 phr | 20 phr |

TABLE 5-continued

| Ingredients | Example 15 | Example 16 | Example 17 | Example 18 | Example 19 |
|---|---|---|---|---|---|
| GE-36 | 30 phr | 30 phr | 30 phr | 30 phr | 30 phr |
| 3-GTS | 3 phr | 3 phr | 3 phr | 3 phr | 3 phr |

The polymer as used in the above Tables 1 to 5, PENB/ROMA-MeOH means that it is a 50:50 molar ratio of PENB/MA ring opened with methanol ($M_w$ 8,500, PDI 1.9, repeat units of formula (IIIA) where Z is O and $R_7$ is methyl). Similarly, NB/ROMA-BuOH means that it is a 50:50 molar ratio of NB/MA ring opened with n-butanol ($M_w$ 12,500, PDI 2.1, repeat units of formula (IIIA) where Z is O and $R_7$ is n-butyl); Sty/ROMI-BuNH$_2$ means that it is a 75:25 molar ratio of styrene/MA ring opened with n-butyl amine ($M_w$ 22,600, PDI 2, repeat units of formula (IIIA) where Z is N-n-butyl and $R_7$ is hydrogen); DecNB/PENB/ROMA-MeOH is a terpolymer of 20/30/50 molar ratio where MA units are ring opened with methanol ($M_w$ 14,500, PDI 1.9); and HFANB/NBEtCOOH is a 75:25 molar ratio copolymer of HFANB and NBEtCOOH ($M_w$ 125,000, PDI 2.3).

Example 20

Spin Coating Procedure

Compositions thus formed in Examples 1-18 were brought to room temperature and each of which were applied to thermal oxide silicon wafers by spin coating first at 500 rpm for 10 seconds followed by a selected spin speed for 30 seconds as further described below.

Example 21

Post Apply Bake Procedure (PAB)

The substrates produced in accordance with the procedures of Example 19 were then placed on a hot plate at selected temperature for a sufficient length of time as further described in the following examples to obtain a polymer film.

Example 22

Photo Imaging Procedures

Each polymer film was then imagewise exposed through a broad band Hg-vapor light source (at 365 nm using a band pass filter) either using a patterned mask or without a mask at an effective dose as described in the following examples.

Example 23

Post Exposure Bake (PEB) Procedures

A few of the photo exposed films from Example 22 were then post exposure baked on a hot plate at a selected temperature for a selected time as further described in the following examples.

Example 24

Aqueous Base Developing Procedure

Each film after exposure in accordance with procedures of Example 22 and some film samples after PEB procedures in accordance of procedures as set forth in Example 23 were developed as follows. The exposed substrates and in some cases exposed and post exposure baked substrates were immersed in developer (2.38 wt. % TMAH) for various times (immersion development). The unexposed area film thickness loss or dark field loss (DFL) of the films that exhibit positive tone (PT) image development is determined by measuring the film thicknesses before and after development in an unexposed region of the film and reported as percent loss of the film thickness in areas of the film that is not exposed to the radiation. The exposed area film thickness loss or bright field loss (BFL) of the films that exhibit negative tone (NT) image development is determined by measuring the film thicknesses before and after development in an exposed region of the film and reported as percent loss of the film thickness in areas of the to film that is exposed to the radiation.

Example 25

Dissolution Rate Measurements

The film thicknesses of the coated films were measured using a profiler before and after immersion in an aqueous base developer (2.38 wt. % TMAH). The dissolution rates were calculated based on the measured film thickness loss and the time of immersion to the developer.

Example 26

Curing Procedures

The spin coated film samples were baked, as needed, in an oven under nitrogen atmosphere in order to further remove any residual solvents and to thermally cure the films at 180° C. for 2 hours. These cured films were used to measure their thermo-mechanical properties, such as wafer stress, Young's modulus, tensile strength (TS), elongation to break (ETB), glass transition temperature ($T_g$), coefficient of thermal expansion (CTE), thermal decomposition temperatures, thermal cycling test (TCT), thermo-oxidative stability test (TOS), adhesion to Si, adhesion to Cu and pattern flow.

The following Examples 26 to 33 illustrate the photo-imageability of the compositions of this invention.

Example 27

The composition of Example 1 was spin coated on a 4-inch thermal oxide silicon wafer at 1400 rpm for 30 seconds and post apply baked (PAB) at 110° C. for 3 minutes to obtain a film of 10.5 μm thickness. The film was then exposed using a patterned mask to a broad band Hg-vapor light source (at 365 nm using a band pass filter) and at an exposure dose of 327 mJ/cm². It was then post exposure baked (PEB) at 140° C. for 5 minutes resulting in a film thickness of 10.2 μm. After developing for 45 seconds in 2.38 wt. % TMAH the film thickness in the exposed region decreased to 8.1 μm and the film of the unexposed regions were completely removed forming a negative tone image. It is evident from the optical micrograph images taken top-down the 10 μm trenches and 20 μm line patterns were clearly observed. The calculated bright field loss (BFL) was 21%.

Example 28

The composition of Example 2 was spin coated on a 4-inch thermal oxide silicon wafer at 1300 rpm for 30 seconds and post apply baked (PAB) at 120° C. for 3 minutes to obtain a film of 9.7 μm thickness. The film was then exposed using a patterned mask to a broad band Hg-vapor light source (at 365 nm using a band pass filter) and at an exposure dose of 350 mJ/cm$^2$. It was then post exposure baked (PEB) at 140° C. for 5 minutes resulting in a film thickness of 9.1 μm. After developing for 50 seconds in 2.38 wt. % TMAH the film thickness in the exposed region slightly increased to 9.3 μm and the film of the unexposed regions were completely removed forming a negative tone image. It is evident from the optical micrograph images taken top-down the 10 μm trenches and 20 μm line patterns were clearly observed. The calculated bright field loss (BFL) was −2% indicating the film thickness gain of 2% in the exposed region.

Example 29

The composition of Example 4 was spin coated on a 4-inch thermal oxide silicon wafer at 1100 rpm for 30 seconds and post apply baked (PAB) at 120° C. for 3 minutes to obtain a film of 10.1 μm thickness. The film was then exposed using a patterned mask to a broad band Hg-vapor light source (at 365 nm using a band pass filter) and at an exposure dose of 400 mJ/cm$^2$. It was then post exposure baked (PEB) at 135° C. for 5 minutes resulting in a film thickness of 9.8 μm. After developing for 120 seconds in 2.38 wt. % TMAH the film thickness in the exposed region slightly decreased to 9.4 μm and the film of the unexposed regions were completely removed forming a negative tone image. It is evident from the optical micrograph images taken top-down the 10 μm trenches and 20 μm line patterns were clearly observed. The calculated bright field loss (BFL) was 4%.

FIG. 1 shows the SEM photograph of 22.8 μm space and 30.9 μm lines formed by the negative tone photo-imaging evidencing high quality images can be obtained by the compositions of this invention.

Example 30

The composition of Example 9 was spin coated on a 4-inch thermal oxide silicon wafer at 4000 rpm for 30 seconds and post apply baked (PAB) at 100° C. for 3 minutes to obtain a film of 1.8 μm thickness. The film was then exposed using a patterned mask to a broad band Hg-vapor light source (at 365 nm using a band pass filter) and at an exposure dose of 327 mJ/cm$^2$. It was then post exposure baked (PEB) at 120° C. for 2 minutes. After developing for 30 seconds in 2.38 wt. % TMAH the film thickness in the exposed region decreased to 1.4 μm and the film of the unexposed regions were completely removed forming a negative tone image. It is evident from the optical micrograph images taken top-down the 3 μm lines, 10 μm pillars and 50 μm contact hole patterns were clearly observed. The calculated bright field loss (BFL) was 21%.

Example 31

The composition of Example 10 was spin coated on a 4-inch thermal oxide silicon wafer at 3000 rpm for 30 seconds and post apply baked (PAB) at 100° C. for 2 minutes to obtain a film of 2.7 μm thickness. The film was then exposed using a patterned mask to a broad band Hg-vapor light source (at 365 nm using a band pass filter) and at an exposure dose of 510 mJ/cm$^2$. It was then post exposure baked (PEB) at 115° C. for 4 minutes. After developing for 35 seconds in 2.38 wt. % TMAH the film thickness in the exposed region decreased to 2.2 μm and the film of the unexposed regions were completely removed forming a negative tone image. It is evident from the optical micrograph images taken top-down the 3 μm lines, 10 μm pillars and 50 μm contact hole patterns were clearly observed. The calculated bright field loss (BFL) was 18%.

Example 32

The composition of Example 11 was spin coated on a 4-inch thermal oxide silicon wafer at 2000 rpm for 30 seconds and post apply baked (PAB) at 100° C. for 2 minutes to obtain a film of 1.6 μm thickness. The film was then exposed using a patterned mask to a broad band Hg-vapor light source (at 365 nm using a band pass filter) and at an exposure dose of 791 mJ/cm$^2$. It was then post exposure baked (PEB) at 120° C. for 3 minutes. After developing for 105 seconds in 2.38 wt. % TMAH the film thickness in the exposed region decreased to 0.1 μm and the film of the unexposed regions were completely removed forming a negative tone image. The calculated bright field loss (BFL) was 94%.

Example 33

The composition of Example 12 was spin coated on a 4-inch thermal oxide silicon wafer at 700 rpm for 30 seconds and post apply baked (PAB) at 110° C. for 2 minutes to obtain a film of 13 μm thickness. The film was then exposed using a patterned mask to a broad band Hg-vapor light source (at 365 nm using a band pass filter) and at an exposure dose of 800 mJ/cm$^2$. After developing for 7 seconds in 2.38 wt. % TMAH the film thickness in the unexposed region decreased to 8.7 μm and the film of the exposed regions were completely removed forming a positive tone image. The calculated dark field loss (DFL) was 33%.

Figure 2:
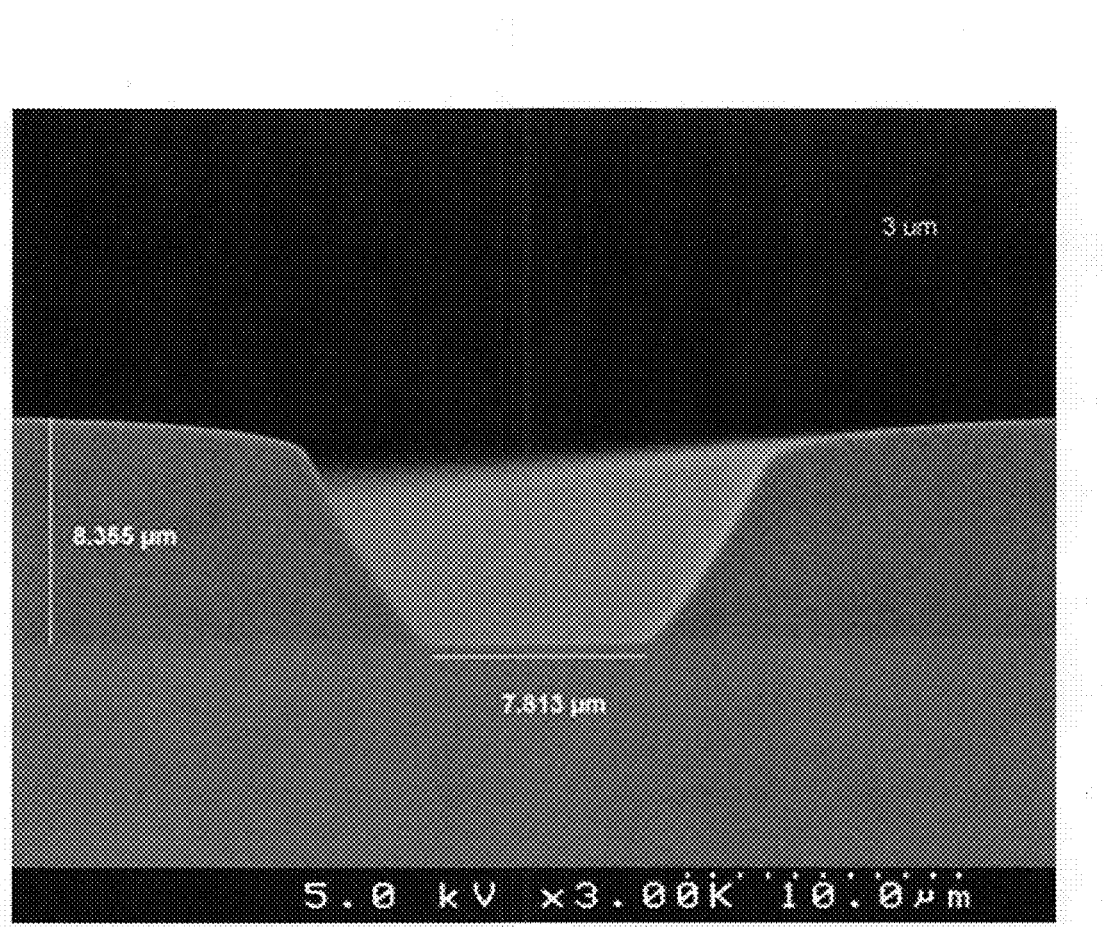
FIG. 2 shows another SEM of a positive tone photo image formed from a composition embodiment of this invention.

FIG. 2 shows the SEM photograph where a 7.8 μm space is clearly visible, thus evidencing that the compositions of this invention can readily be tailored to form positive tone images.

Example 34

The composition of Example 13 was spin coated on a 4-inch thermal oxide silicon wafer at 1000 rpm for 30 seconds and post apply baked (PAB) at 100° C. for 3 minutes to obtain a film of 9.8 μm thickness. The film was then exposed using a patterned mask to a broad band Hg-vapor light source (at 365 nm using a band pass filter) and at an exposure dose of 644 mJ/cm$^2$. It was then post exposure baked (PEB) at 140° C. for 3 minutes. After developing for 40 seconds in 2.38 wt. % TMAH the film thickness in the exposed region decreased to 8.6 μm and the film of the unexposed regions were completely removed forming a negative tone image. It is evident from the optical micrograph images taken top-down the 2 μm line pattern formations were clearly observed. The calculated bright field loss (BFL) was 6%.

Example 35

The composition of Example 17 was spin coated on a 4-inch thermal oxide silicon wafer at 1000 rpm for 30 seconds and post apply baked (PAB) at 100° C. for 3 minutes to obtain a film of 9.2 µm thickness. The film was then exposed using a patterned mask to a broad band Hg-vapor light source (at 365 nm using a band pass filter) and at an exposure dose of 1000 mJ/cm$^2$. It was then post exposure baked (PEB) at 140° C. for 3 minutes. After developing for 60 seconds in 2.38 wt. % TMAH the film thickness in the exposed region slightly decreased to 8.3 µm and the film of the unexposed regions were completely removed forming a negative tone image. It is evident from the optical micrograph images taken top-down the 25 µm line and 100 µm via patterns were clearly observed. The calculated bright field loss (BFL) was 9%.

Example 36

The composition of Example 19 was spin coated on a 5-inch thermal oxide silicon wafer at 1800 rpm for 30 seconds and post apply baked (PAB) at 100° C. for 3 minutes to obtain a film of 9.6 µm thickness. The film was then exposed using a patterned mask to a broad band Hg-vapor light source (at 365 nm using a band pass filter) and at an exposure dose of 405 mJ/cm$^2$. It was then post exposure baked (PEB) at 120° C. for 5 minutes. After developing for 25 seconds in 2.38 wt. % TMAH the film thickness in the exposed region decreased to 7.9 µm and the film of the unexposed regions were completely removed forming a negative tone image. It is evident from the optical micrograph images taken top-down the 10 µm line and 25 µm via patterns were clearly observed. The calculated bright field loss (BFL) was 18%.

Dissolution Rate Measurements

The following Examples 37 and 38 illustrate the procedures to measure the dissolution rate of the compositions of this invention to demonstrate positive tone or negative tone behaviors.

Example 37

The composition of Example 6 was spin coated on a 4-inch thermal oxide silicon wafer at 2000 rpm for 30 seconds and post apply baked (PAB) at 130° C. for 3 minutes. The wafer was cleaved into two parts. The dissolution rate of one part of this film was measured by the immersion in 2.38 wt. % TMAH and measuring the film thicknesses before and after TMAH immersion. The measured dissolution rate was 215 nm/sec. The other part of the film was first exposed to a blanket exposure dose of 1 J/cm$^2$ (EXD) and then its dissolution rate was measured similarly, which increased to 536 nm/sec indicating a positive tone (PT) behavior. That is, the exposed areas became more soluble upon exposure to a radiation.

The same formulation was spin coated at 2000 rpm for 30 seconds on a 4-inch thermal oxide silicon wafer and post apply baked at 130° C. for 3 minutes and cleaved to two parts. One part was further baked at 130° C. for 3 minutes to mimic the post exposure bake (PEB) condition. The dissolution rate of this film was 100 nm/sec. The other part of this film was exposed to a radiation dose of 1 J/cm$^2$ (EXD). Then this exposed part was post exposure baked at 130° C. for 3 minutes (PEB), and the dissolution rate was measured, which was significantly decreased and had 1% swelling of the film thickness indicating a negative tone (NT) behavior.

Example 38

The composition of Example 7 was spin coated at 2000 rpm for 30 seconds on a 4-inch thermal oxide silicon wafer and post apply baked at 130° C. for 3 minutes and cleaved into two parts. The first part was further baked at 130° C. for 3 minutes to mimic the post exposure bake (PEB) condition. The dissolution rate of this film was 61 nm/sec. The second part of this film was exposed to 1 J/cm$^2$ dose (EXD). The exposed part was then post exposure baked at 130° C. for 3 minutes (PEB), and its dissolution rate was measured similarly, which was significantly decreased and had 6% swelling of the film thickness indicating a negative tone (NT) behavior.

Example 39

Two samples each from the composition of Examples 8A to 8D were spin coated as follows: one at 1000 rpm for 30 seconds on thermal oxide silicon wafer to obtain a film thickness of about 2 µm and the second one at 2000 rpm for 30 seconds to obtain a film thickness of about 1.5 µm. All of these film samples were post apply baked at 100° C. for 3 minutes. The film thicknesses (FT) of the films were measured and then exposed to 510 mJ/cm$^2$ exposure dose. The exposed films were post exposure baked (PEB) at various temperatures for 5 minutes and immersed into 2.38% TMAH, rinsed with water, air dried and their film thicknesses measured. The results, including the initial FT, PEB temperature employed in each sample, develop time, final FT and percent FT retention are summarized in Table 6. It is evident from the data presented in Table 6 that the film thicknesses retained in various amounts indicating the degree of photo cross linking. The PBG-4 has the best photo cross linking ability among the four photobase generators tested.

TABLE 6

| Example No. | PBG | Initial FT, µm | PEB, ° C. | Develop time, sec | Final FT, µm | % FT retention |
| --- | --- | --- | --- | --- | --- | --- |
| 8A | PBG-1 | 2.13 | 130 | 37 | 0 | 0 |
| 8A | PBG-1 | 1.46 | 135 | 30 | 0.07 | 5 |
| 8B | PBG-2 | 2.06 | 130 | 15 | 0.51 | 25 |
| 8B | PBG-2 | 1.46 | 135 | 30 | 0.81 | 55 |
| 8C | PBG-3 | 2.14 | 130 | 15 | 1.13 | 53 |
| 8C | PBG-3 | 1.42 | 135 | 30 | 0.85 | 60 |
| 8D | PBG-4 | 2.12 | 130 | 120 | 1.96 | 92 |
| 8D | PBG-4 | 1.51 | 125 | 80 | 1.32 | 87 |

The following Example 40 illustrates the shelf life stability of the compositions of this invention.

Example 40

The viscosity of the composition from Example 3 was monitored for 14 days at room temperature. The viscosity changed as follows; day-0, 340 cps; day-6, 323 cps; day-9, 317 cps; day-14, 358 cps. According to these results the viscosity of the formulation kept at room temperature increased only about 5% in two weeks demonstrating the compositions of this invention are quite stable at room temperature.

The following Example 41 further demonstrates that the compositions of this to invention exhibit good thermomechanical properties, such as Young's modulus, wafer stress, tensile strength (TS), ETB, CTE and $T_g$, among others, as summarized in Table 7.

Example 41

The composition Examples 1 to 5 and Example 14 were spin coated onto a 5-inch bare silicon wafers to obtain films in the thickness range from 9-13 μm. These films were exposed to a radiation at a dosage level from 500-1000 mJ/cm² and post exposure baked at 130-140° C. range to 3-5 minutes. These films were cured in an oven under nitrogen atmosphere at 180° C. for 2 hours. Then various thermomechanical properties of these films were measured as summarized in Table 7. It is evident from these results that the films obtained from the compositions of this invention exhibit low wafer stress and high elongation to break, among various other improved properties as summarized in Table 7.

marized in Table 9. It is evident from this data that sidewall angle and film loss improve with higher exposure energy.

FIGS. 3A to 3C show the SEM micrographs of a cross section of 75 μm vias obtained with the composition of Example 42. It is very clear from these micrographs that increasing the exposure energy dosage from 150 mJ/cm² to 400 mJ/cm², the bright field film loss (BFL) decreased substantially from 38% to 10%, and at the same time the sidewall angle steadily increased from 53° to 680. Similar results are obtained for the composition of Example 43 as evidenced by the SEM micrographs shown in FIGS. 4A to 4C. By increasing the exposure dosage from 100 mJ/cm² to 300 mJ/cm² the measured BFL decreased from 17% to 7% for FIGS. 4A to 4C. The side wall angle was also increased substantially from 25° to 82°, thus evidencing that the exposure doses (EXD) of the compositions of this invention can readily be tailored to increase the side wall angles and decrease the degree of film loss.

TABLE 7

| Property | Example 1 | Example 2 | Example 3 | Example 4 | Example 5 | Example 14 |
|---|---|---|---|---|---|---|
| TCT | Pass | — | — | Pass | Pass | — |
| TOS | — | — | Pass | — | — | — |
| Adhesion to Si | — | — | Pass | Pass | — | — |
| Adhesion to Cu | — | — | Pass | Pass | — | — |
| Young's Modulus (GPa) | 1.1 ± 0.1 | 1.4 ± 0.01 | 1.1 ± 0.04 | 2.3 ± 0.1 | 2.0 ± 0.1 | 0.98 ± 0.08 |
| Tensile Strength (MPa) | 19 ± 2 | 26 ± 2 | 21 ± 5 | 43 ± 3 | 36 ± 6 | 18 ± 2 |
| ETB (%) | 14 ± 15 | 35 ± 15 | 24 ± 5 | 5 ± 2 | 4 ± 3 | 4 ± 1 |
| CTE (ppmK$^{-1}$) | 200 | 175 | 130 | — | 60 | — |
| Wafer stress (MPa) | 4 ± 3 | 4 ± 2 | 3 ± 2 | 17 | 8 ± 1 | 5 ± 3 |
| $T_g$ (° C.) | 122 | | 119 | 156 | 144 | — |

The following Examples 42 and 43 illustrate the use of different exposure dosage to improve the quality of the images obtained therefrom.

Examples 42-43

The composition of Example 19 was used in Example 42. The composition of Example 4 was substantially used in Example 43 with the exception of employing 20 phr of TMPTGE and 30 phr of GE-36 as crosslinking agents.

Each of the compositions were then spin coated on a 4-inch thermal oxide silicon wafer substantially using the procedures as set forth respectively in Examples 29 and 36. The wafers were post apply baked (PAB) at 120° C. for 3 minutes. The films were then exposed using a patterned mask to a broad band Hg-vapor light source (at 365 nm using a band pass filter) and each film was exposed at different exposure dosages (EXD, mJ/cm²), as summarized in Table 8. Each of the exposed films were then post exposure baked (PEB) at 140° C. for 5 minutes and developed as described in Examples 29 and 36. Then SEM photographs were taken of each of the exposed film. The measured bright filed loss (BFL) for each of the films formed and the measured sidewall angles of 75 μm vias are sum-

TABLE 9

| | Example 42 | | Example 43 | |
|---|---|---|---|---|
| EXD, mJ/cm² | BFL, % | Side wall angle | BFL, % | Side wall angle |
| 100 | — | — | 17 | 25° |
| 150 | 38 | 53° | — | — |
| 200 | — | — | 8.3 | 57° |
| 250 | 21 | 58° | — | — |
| 300 | — | — | 7.2 | 82° |
| 400 | 10 | 68° | — | — |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A photoimagable composition comprising:
   a) a polymer consisting of one or more first repeating units represented by formula (IA), said first repeating unit is derived from a monomer of formula (I):

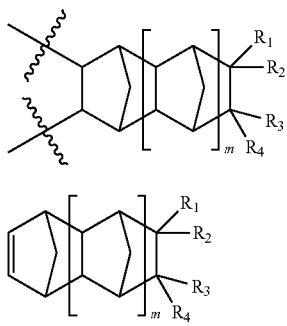

(IA)

(I)

wherein:

m is an integer 0, 1 or 2;

$R_1$, $R_2$, $R_3$ and $R_4$ are the same or different and each independently selected from the group consisting of hydrogen, halogen, linear or branched $(C_1-C_{12})$alkyl, linear or branched hydroxy$(C_1-C_{12})$alkyl, linear or branched perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy, $-(CH_2)_a-C(CF_3)_2OR$, $-(CH_2)_a-CO_2R$, a group of formula (A):

$-(CH_2)_b-(OCH_2-CH_2)_c-OR$ (A); and a group of formula (B):

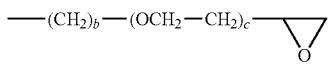

(B)

wherein:

a is an integer from 0 to 4 b is an integer from 0 to 10;

c is an integer 0, 1, 2, 3 or 4; and

R is selected from the group consisting of hydrogen, linear or branched $(C_1-C_6)$alkyl, $(C_5-C_8)$cycloalkyl, $(C_6-C_{10})$aryl and $(C_7-C_{12})$aralkyl;

a second repeating unit represented by formula (IIA), said second repeating unit is derived from a monomer of formula (II):

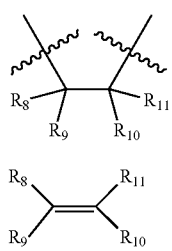

(IIA)

(II)

wherein $R_8$, $R_9$, $R_{10}$ and $R_{11}$ are the same or different and each independently of one another is selected from the group consisting of hydrogen, linear or branched $(C_1-C_6)$ alkyl, $(C_5-C_8)$cycloalkyl, $(C_6-C_{10})$aryl and $(C_7-C_{12})$ aralkyl;

and a third repeating unit selected from the group consisting of a repeating unit of formula (IIIA) and a repeating unit of formula (IIIB), said third repeating unit is derived from a monomer of formula (III):

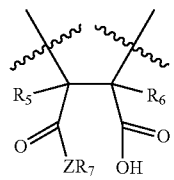

(IIIA)

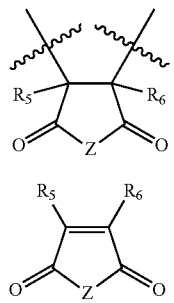

(IIIB)

(III)

wherein:

Z is O or N—$R_{12}$ wherein $R_{12}$ is selected from the group consisting of hydrogen, linear or branched $(C_1-C_9)$ alkyl, $(C_3-C_7)$cycloalkyl and $(C_6-C_{12})$aryl;

$R_5$, $R_6$ and $R_7$ are each independently of one another selected from the group consisting of hydrogen, linear or branched $(C_1-C_9)$alkyl, fluorinated or perfluorinated $(C_1-C_9)$alkyl, $(C_6-C_{12})$aryl and $(C_6-C_{12})$aryl$(C_1-C_{12})$ alkyl; and wherein each of aforementioned groups, where valence is permissible, is optionally substituted with one or more groups selected from the group consisting of linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, acetoxy, phenyl, hydroxyphenyl and acetoxyphenyl;

b) a photobase generator selected from the group consisting of:

a compound of formula (IV):

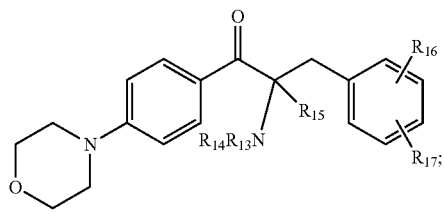

(IV)

a compound of formula (V):

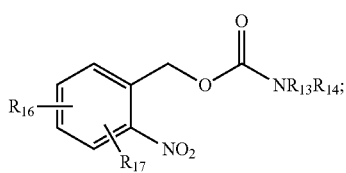

a compound of formula (VI):

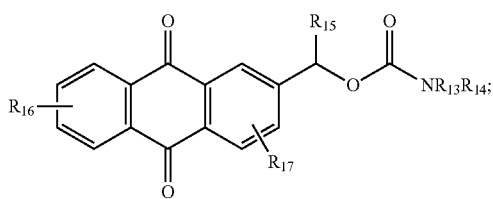

a compound of formula (VIIA):

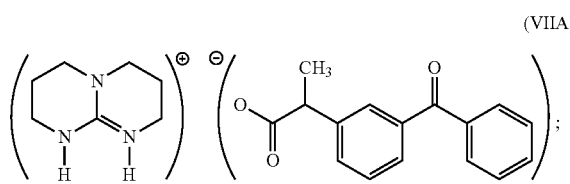

a compound of formula (VIIB):

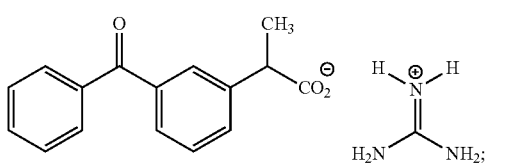

and
a compound of formula (VIIC):

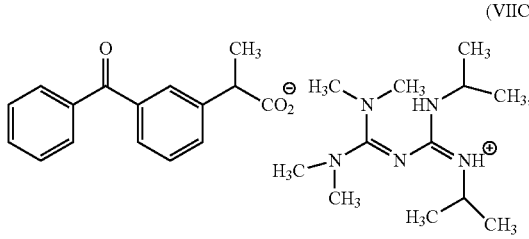

wherein
$R_{13}$ and $R_{14}$ each independently of each other selected from the group consisting of hydrogen, linear or branched $(C_1-C_8)$alkyl and $(C_6-C_{10})$aryl; or $R_{13}$ and $R_{14}$ taken together with the nitrogen atom to which they are attached form a 5 to 7 membered monocyclic ring or 6 to 12 membered bicyclic ring, said rings optionally containing one or more heteroatoms selected from O and N, and said rings optionally substituted with a group selected from the group consisting of linear or branched $(C_1-C_8)$alkyl, $(C_6-C_{10})$aryl, halogen, hydroxy, linear or branched $(C_1-C_8)$alkoxy and $(C_6-C_{10})$aryloxy; and $R_{15}$, $R_{16}$ and $R_{17}$ are the same or different and each independently of one another selected from the group consisting of hydrogen, linear or branched $(C_1-C_{16})$alkyl, $(C_6-C_{10})$aryl, $(C_6-C_{10})$aryl$(C_1-C_3)$alkyl, hydroxy, halogen, linear or branched $(C_1-C_{12})$alkoxy and $(C_6-C_{10})$aryloxy; and c) a carrier solvent.

2. The composition of claim 1, wherein the polymer consists of:
one or more first repeat units derived from the corresponding monomers selected from the group consisting of:
bicyclo[2.2.1]hept-2-ene;
5-decylbicyclo[2.2.1]hept-2-ene;
norbornenyl-2-trifluoromethyl-3,3,3-trifluoropropan-2-ol;
5-phenethylbicyclo[2.2.1]hept-2-ene; and
norbornenylpropanoic acid;
one or more second repeat units derived from the corresponding monomers selected from the group consisting of:
styrene; and
□-methylstyrene; and
one or more third repeat units derived from the corresponding monomers selected from the group consisting of:
maleic anhydride; and
2-methyl-maleic anhydride.

3. A photoimagable composition comprising:
a) a copolymer containing repeating units derived from styrene and ring opened maleic anhydride repeat units which is ring opened with n-butylamine;
b) a photobase generator selected from the group consisting of:
a compound of formula (IV):

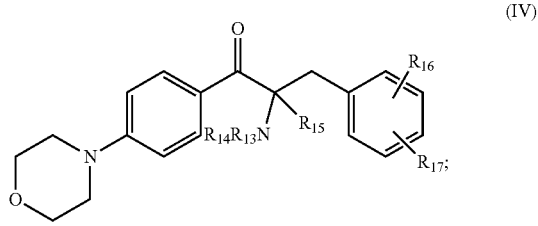

a compound of formula (V):

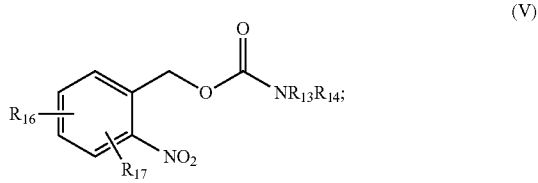

a compound of formula (VI):

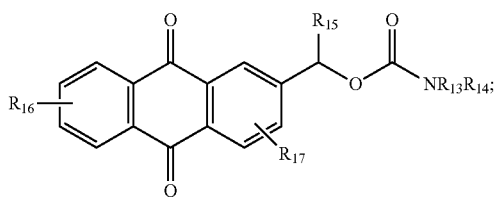

a compound of formula (VIIA):

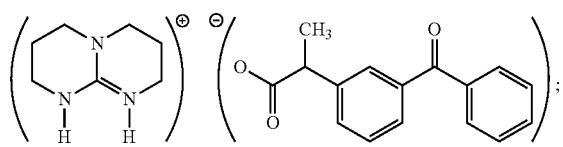

a compound of formula (VIIB):

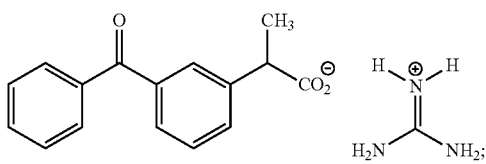

and
a compound of formula (VIIC):

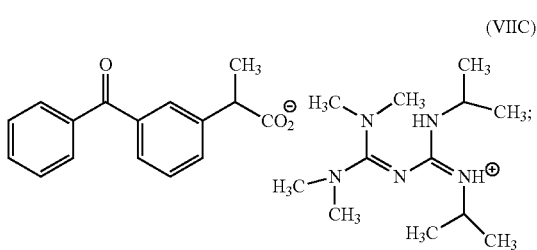

wherein
$R_{13}$ and $R_{14}$ each independently of each other selected from the group consisting of hydrogen, linear or branched $(C_1\text{-}C_8)$alkyl and $(C_6\text{-}C_{10})$aryl; or
$R_{13}$ and $R_{14}$ taken together with the nitrogen atom to which they are attached form a 5 to 7 membered monocyclic ring or 6 to 12 membered bicyclic ring, said rings optionally containing one or more heteroatoms selected from O and N, and said rings optionally substituted with a group selected from the group consisting of linear or branched $(C_1\text{-}C_8)$alkyl, $(C_6\text{-}C_{10})$aryl, halogen, hydroxy, linear or branched $(C_1\text{-}C_8)$alkoxy and $(C_6\text{-}C_{10})$aryloxy; and
$R_{15}$, $R_{16}$ and $R_{17}$ are the same or different and each independently of one another selected from the group consisting of hydrogen, linear or branched $(C_1\text{-}C_{16})$alkyl, $(C_6\text{-}C_{10})$aryl, $(C_6\text{-}C_{10})$aryl$(C_1\text{-}C_3)$alkyl, hydroxy, halogen, linear or branched $(C_1\text{-}C_{12})$alkoxy and $(C_6\text{-}C_{10})$aryloxy; and
c) a carrier solvent.

4. The composition of claim 3, wherein the photobase generator is a compound of formula (IV):

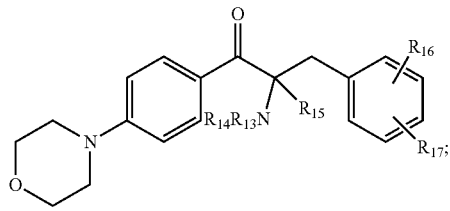

wherein
$R_{13}$ and $R_{14}$ each independently of each other selected from the group consisting of hydrogen, methyl, ethyl, n-propyl, isopropyl and phenyl;
and
$R_{15}$, $R_{16}$ and $R_{17}$ are the same or different and each independently of one another selected from the group consisting of hydrogen, methyl, ethyl, n-propyl, isopropyl, methoxy, ethoxy, n-propoxy and isopropoxy.

5. The composition of claim 3, wherein the photobase generator is a compound of formula (V):

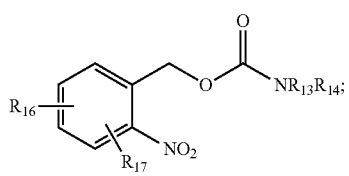

wherein
$R_{13}$ and $R_{14}$ each independently of each other selected from the group consisting of hydrogen, methyl, ethyl, n-propyl, isopropyl and phenyl; or
$R_{13}$ and $R_{14}$ taken together with the nitrogen atom to which they are attached form a five or six membered monocyclic ring, and said ring is optionally substituted with a group selected from the group consisting of methyl, ethyl and hydroxy;
and
$R_{15}$, $R_{16}$ and $R_{17}$ are the same or different and each independently of one another selected from the group consisting of hydrogen, methyl, ethyl, n-propyl, isopropyl, methoxy, ethoxy, n-propoxy and isopropoxy.

6. The composition of claim 3, wherein the photobase generator is selected from the group consisting of:
a compound of formula (VIIA):

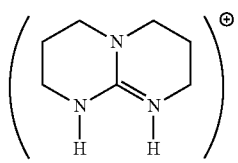

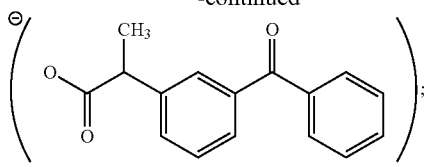

a compound of formula (VIIB):

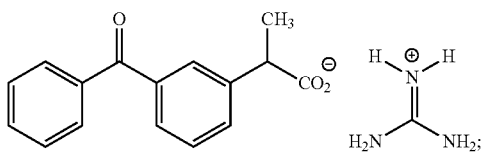
(VIIB)

and
a compound of formula (VIIC):

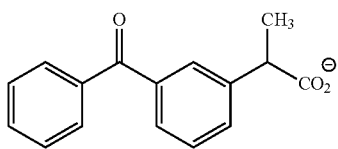
(VIIC)

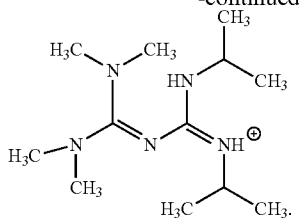

7. The composition of claim 3, wherein the photobase generator is selected from the group consisting of:
2-benzyl-2-(dimethylamino)-1-(4-morpholinophenyl)butan-1-one;
2-(dimethylamino)-2-(4-methylbenzyl)-1-(4-morpholinophenyl)butan-1-one;
2-nitrobenzyl 4-hydroxypiperidine-1-carboxylate;
4,5-dimethoxy-2-nitrobenzyl 2,6-dimethylpiperidine-1-carboxylate;
1-(9,10-dioxo-9,10-dihydroanthracen-2-yl)ethyl cyclohexylcarbamate;
3,4,6,7,8,9-hexahydro-2H-pyrimido[1,2-a]pyrimidin-1-ium 2-(3-benzoylphenyl)propanoate;
1-(9,10-dioxo-9,10-dihydroanthracen-2-yl)ethyl 1H-imidazole-1-carboxylate;
diaminomethaniminium 2-(3-benzoylphenyl)propanoate; and
(Z)—N-(((bis(dimethylamino)methylene)amino)(isopropylamino)-methylene)propan-2-aminium 2-(3-benzoylphenyl)propanoate.

* * * * *